United States Patent
Naik et al.

(10) Patent No.: US 8,571,119 B2
(45) Date of Patent: Oct. 29, 2013

(54) SOFTWARE DEFINED RADIO FOR MODULATION AND DEMODULATION OF MULTIPLE COMMUNICATION STANDARDS

(75) Inventors: Parag Naik, Karnataka (IN); Anindya Saha, Karnataka (IN); Hemant Mallapur, Karnataka (IN); Sunil Hr, Karnataka (IN); Gururaj Padaki, Karnataka (IN)

(73) Assignee: Saankhya Labs Pvt. Ltd, Karnataka (IN)

( * ) Notice: Subject to any disclaimer, the term of this patent is extended or adjusted under 35 U.S.C. 154(b) by 0 days.

(21) Appl. No.: 13/435,326

(22) Filed: Mar. 30, 2012

(65) Prior Publication Data
US 2012/0249888 A1 Oct. 4, 2012

(30) Foreign Application Priority Data
Apr. 1, 2011 (IN) .......................... 1106/CHE/2011

(51) Int. Cl.
*H04L 27/00* (2006.01)
(52) U.S. Cl.
USPC ........... 375/259; 375/262; 375/267; 375/260; 375/299; 375/341; 375/347; 375/349; 375/E1.017; 714/786; 714/784; 714/795; 714/804; 714/E11.033; 455/500; 455/61; 455/101; 455/102; 455/103; 348/726; 348/E5.113; 348/723; 348/724; 348/E5.093; 348/E5.114; 348/E5.038; 348/E5.003
(58) Field of Classification Search
USPC ............. 348/726, E5.113, 723, 724, E5.093, 348/E5.114, E5.038, E5.003; 375/259, 262, 375/267, 260, 299, 341, 347, 349, E1.017; 455/500, 61, 101, 102, 103; 714/784, 714/786, 795, 804, E11.033
See application file for complete search history.

(56) References Cited

U.S. PATENT DOCUMENTS

| | | | |
|---|---|---|---|
| 4,866,395 A | 9/1989 | Hostetter | |
| 5,940,438 A | 8/1999 | Poon et al. | |
| 7,061,985 B2 | 6/2006 | Le | |
| 8,095,173 B2 * | 1/2012 | Chapyzhenka et al. | ... 455/550.1 |
| 2005/0041746 A1 * | 2/2005 | Rosen et al. | .................. 375/242 |
| 2010/0075611 A1 * | 3/2010 | Budampati et al. | ........ 455/67.11 |
| 2010/0124257 A1 * | 5/2010 | Yahya | ........................... 375/219 |

FOREIGN PATENT DOCUMENTS

EP 0928084 A3 11/2001

OTHER PUBLICATIONS

Masaki et al. "A low-IF/zero-IF reconfigurable analog baseband IC with an I/Q imbalance cancellation scheme",IEEE journal of solid state circuit,vol. 46 No. 3, Mar. 2011, pp. 572-583.*
Pucker et al., "Extending the SCA Core Framework Inside the Modem Architecture of a Software Defined Radio", Communications Magazine, vol. 42, Issue. 3, pp. S21-S25, Mar. 2004.
Org et al., "Software Defined Radio Architectures for Mobile Commercial Applications", Proceeding of the SDR 06 Technical Conference and Product Exposition, 2006.
Babla, "Using Software Modems to Enable Low-Cost, Converged Wireless", Mirics Semiconductor, Mar. 2009.

* cited by examiner

*Primary Examiner* — Daniel Washburn
*Assistant Examiner* — Rahel Guarino

(57) ABSTRACT

A Software Defined Radio (SDR) subsystem capable of supporting a multiple communication standards and platforms for modulation, demodulation and trans-modulation of an input signal is provided. The SDR subsystem includes a Signal Conditioning Cluster (SCC) unit that includes a signal conditioning CPU adapted for sample based signal processing, a Signal Processing Cluster (SPC) unit that includes a signal processing CPU adapted for block based signal processing, and a Channel Codec Cluster (CCC) unit that performs a channel encoding or a channel decoding operation.

12 Claims, 27 Drawing Sheets

SOFTWARE DEFINED RADIO FOR MODULATION AND DEMODULATION OF MULTIPLE COMMUNICATION STANDARDS

BACKGROUND

1. Technical Field

The embodiments herein generally relate to modulation, demodulation, and trans-modulation of an input signal, and, more particularly, to a software defined radio subsystem that is capable of supporting modulation, demodulation and trans-modulation for multiple analog and digital communication standards.

2. Description of the Related Art

Typical demodulator solutions today which cater to communication standards such as Digital TV (DTV) standards and/or Analog TV (ATV) standards consist of separate pieces of digital signal processing hardware blocks which are standard specific. With the proliferation of medium specific and region specific communication standards, supporting all standards on a single chassis is becoming necessary to reduce the diversity cost of maintaining different production lines for different standards. If one were to make a system solution using different region and medium specific demodulators, the bill of materials cost would be very high for end customers. The process of developing a single chip to address such diversity using system on chip integration of signal processing hardware blocks leads to very large silicon area thus leading to prohibitively higher costs.

In addition, supporting such a multitude of standards using a single programmable processor would necessitate operating it at an extremely high frequency (e.g., several tens of Gigahertz) which would consume extremely high power thus making it unviable for consumer usage. Hence there is a need to develop a solution which is area inexpensive, that consumes lower power, and that also caters to a multitude of both digital and analog communication standards. Also, RF tuners which interface with various TV demodulators operate at various intermediate frequencies (IF), like a standard IF (36 MHz or 44 MHz), a low IF (4-4.5 Mhz) or a zero IF. This also requires different signal processing hardware blocks based on the IF type. Hence additional area and power would have been incurred if multiple tuners catering to various standards have to be supported on the same chip.

Further, DTV and ATV systems found in the market today are extremely inflexible. They cannot support field upgradeability, additional support of a non-implemented standard, or even support a new feature for an existing standard without mandating a device redesign. With more new DTV standards evolving today, such platforms would need to be redesigned from scratch, due to which a market opportunity window would be lost. There have been attempts made to address these requirements individually. One such approach to address the issue of demodulators interfacing to multiple types of tuners (e.g. standard IF, low IF and zero IF) is to build DSP hardware which is standard specific.

For interfacing to zero-IF tuners, typically two separate sampling paths obtained from an IQ ADC (Analog to Digital Converter) are required whereas for interfacing to a standard IF or a low IF tuner only one sampling path is required. Some implementations which can utilize a shared hardware for two standards can be envisioned, but they are not capable of handling more digital TV standards (ATSC, DVB-T, DVB-S, J.83A.J.83B, J.83C, ISDB-T, CDMB-T) and analog TV standards (NSTC, SECAM and PAL). One such architecture tries to perform symbol processing tasks on a DSP processor and signal conditioning stages like filtering and spectrum shaping in beginning stages within an optimized hardware accelerator. However, due to this, it is impossible for the architecture to interface to different tuners with differing intermediate frequencies.

In addition, a requirement for supporting different intermediate frequencies (e.g., 4.5 MHz, 36 MHz, and 44 MHz) and different types of tuners (e.g., a CAN tuner, a silicon tuner) requires multiple hardware signal processing chains working in parallel. Such a solution would inevitably be area expensive thus increasing cost of the demodulator. FIG. 1 illustrates a typical Advanced Television Systems Committee (ATSC) demodulation signal chain 100. The ATSC demodulation signal chain 100 includes (i) a Numerically Controlled Oscillator (NCO) 102, (ii) a pilot frequency estimation stage 104, (iii) an adjacent channel filter 106, (iv) an upsampling filter 108, (v) a sample rate convertor & matched filter 110, (vi) a band extraction stage 112, (vii) a sampling frequency offset estimation stage 114, (viii) a carrier recovery stage 116, (ix) a pilot removal stage 118, (x) a segment sync & frame sync detection stage 120, (xi) a Least Mean Square (LMS) equalizer 122, (xii) an inner deinterleaver stage 124, (xiii) a trellis decoding stage 126, (xiv) an outer deinterleaver 128, and (xv) a Reed-Solomon (RS) decoder & de-randomizer stage 130.

FIG. 2 illustrates a typical cable demodulation (J.83A and J.83C) signal chain 200. The cable demodulation (J.83A and J.83C) signal chain 200 includes a Numerically-Controlled Oscillator (NCO) 202, a down-sampling filter 204, an adjacent channel filter 206, an upsampling filter 208, an interpolation filter 210, a timing recovery stage 212, a coarse carrier recovery stage 214, a Least Mean Square (LMS) equalizer 216, a de-mapper 218, a frame sync detection stage 220, an outer deinterleaver 222, and a Reed-Solomon (RS) decoder & de-randomizer stage 224.

FIG. 3 illustrates a typical cable demodulation (J.83B) chain 300. The cable demodulation (J.83B) chain 300 includes a Numerically Controlled Oscillator (NCO) 302, a down-sampling filter 304, an adjacent channel filter 306, an upsampling filter 308, an interpolation filter 310, a timing recovery stage 312, a coarse carrier recovery stage 314, a Least Mean Square (LMS) equalizer 316, a trellis decoding stage 318, a frame sync detection stage 320, an outer deinterleaver 322, and a Reed-Solomon (RS) decoder & de-randomizer 324.

FIG. 4A illustrates a typical Digital Video Broadcasting—Terrestrial (DVB-T) demodulator chain 400A that includes a Numerically Controlled Oscillator (NCO) 402, an IF to baseband conversion stage 404, a downsampling filter 406, an adjacent channel filter 408, an interpolation filter 410, a time domain synchronization stage 412, a Fast Fourier Transform (FFT) stage 414, a frequency domain synchronization stage 416, a pilot processing stage 418, a channel estimation stage 420, a fine symbol synchronization stage 422, a frame sync detection stage 424, a channel correction and de-mapper stage 426, a bit deinterleaver stage 428, a viterbi decoding stage 430, an outer deinterleaver 432, and a Reed-Solomon (RS) decoder & de-randomizer stage 434.

FIG. 4B illustrates a typical Digital Video Broadcasting-Satellite (DVB-S) demodulation chain 400B that includes a numerically-controlled oscillator (NCO) 402, a down-sampling filter 406, an adjacent channel filter 408, an upsampling filter 436, an interpolation filter 410, a timing recovery stage 438, a coarse carrier recovery stage 440, a data selection & discard stage 442, an inner deinterleaver stage 444, a trellis decoding stage 446, a frame sync detection stage 424, an outer deinterleaver 432, and a Reed-Solomon (RS) decoder & de-randomizer stage 434.

FIG. 5 illustrates a typical Integrated Services Digital Broadcasting-Terrestrial (ISDB-T) demodulator chain 500 that includes (i) a Numerically Controlled Oscillator (NCO) 502, (ii) an IF to baseband conversion stage 504, (iii) a down-sampling filter 506, (iv) an adjacent channel filter 508, (v) an interpolation filter 510, (vi) a time domain synchronization stage 512, (vii) a Fast Fourier Transform (FFT) stage 514, (viii) a frequency domain synchronization stage 516, (ix) a Transmission and Multiplexing Configuration Control (TMCC) decoding stage 518, (x) a frequency and time domain deinterleaver 520, (xi) a channel estimation stage 522, (xii) a hierarchical multiplexer stage 524, (xiii) a channel correction and de-mapper stage 526, (xiv) a bit deinterleaver stage 528, (xv) a viterbi decoding stage 530, (xvi) an outer deinterleaver stage 532, and (xvii) a Reed-Solomon (RS) decoder & de-randomizer stage 534.

FIG. 6 illustrates a typical analog TV signal demodulation chain 600 for the analog TV standards Phase Alternating Line (PAL), National Television System Committee (NTSC) or Sequential Couleur Avec Memoire (SECAM). The analog TV signal demodulation chain 600 includes (i) a Numerically Controlled Oscillator (NCO) 602, (ii) a carrier recovery stage 604, (iii) an image rejection and down sampler stage 606, (iv) an adjacent channel nyquist filter 608, (v) a video low pass filter 610, (vi) a group delay equalization filter 612, (vii) a DC and gain adjust stage 614, (viii) an upsampling filter 616A, (viii) an upsampling filter 616B, and (ix) an audio band pass filter 618. The signal chains of FIGS. 1 to 6 are typically implemented either using hardwired architectures, general purpose DSPs or Application specific Signal processors (ASSP).

Hardwired architectures are ideally suited for implementing standard specific demodulation. However they are not flexible and cannot be reused as they are more expensive. The hardwired architecture does not scale with addition of new features or standards. Receivers perform complex signal processing algorithms that need to be adaptive. Any minor changes force an expensive silicon re-spin. Further, as the number of standards to be supported increases, hardwired architectures need more 'silicon real estate'. This results in higher recurring costs. In addition, moving hardware implementation blocks across product lines is difficult and expensive. A general purpose programmable DSP like the TI C6x can be an alternative to the hardwired architectures. However a general purpose DSP is targeted for a wide range of applications like MPEG decoding, graphics and others. This leads to a solution that is prohibitively expensive for consumer applications.

The hardwired architectures and general purpose DSPs are two ends of the spectrum. The benefits of both a hardwired architecture and a DSP can be met by an architecture based on Application Specific Signal Processors (ASSP). These ASSPs are designed specifically to solve a class of signal processing problems in an application.

FIG. 7 illustrates a cost 702 versus flexibility 704 a curve 700 for different architectures such as an ASIC, a GPP (General Purpose Processor), a DSP (Digital Signal Processor), and an ASSP (Application specific Signal processor). The cost versus flexibility curve 700 illustrates that ASSPs are characterized by maximum flexibility at lowest cost.

An alternative implementation of a demodulator can be envisioned by integrating standard specific demodulators with separate paths in their receive signal processing chains. This could start from Intermediate Frequency (IF) processing which is done at sample rate, and end with demapping which is performed at a symbol rate, just before an inner and an outer decoding is performed. However such a demodulator that is constructed by integrating standard specific demodulators would be area and cost expensive, and would also consume significantly more power. It is extremely difficult to create a reusable-shared hardwired architecture to cater to all digital and analog TV standards due to a multitude of reasons. One such reason is that the sampling rate of IF signals obtained in various TV standards required for receiving them with minimum adjacent channel interference is different for each of the standards. The frequencies may range from 25 MHz to 80 MHz.

In addition, for zero IF tuners, there is additional processing required for IQ imbalance correction, which is absent in standard and low-IF tuners. Hence, it is impossible to supporting all types of tuners for several Intermediate frequencies (IF) using shared resources, since several replicas of hardware for IF processing tuned to respective standards are required. Further, some standards are based on a single carrier (e.g. ATSC, single carrier mode of CDMB-T, NTSC, PAL and SECAM) while some others like DVB-T, DVB-S, ISDB-T, multicarrier mode of CDMB-T are based on multi-carrier modulation techniques like OFDM. While demodulation of multicarrier standards is typically done using block based techniques, single carrier standards cannot be treated in a similar way. This typically leads to two different philosophies of hardware design which are impossible to merge and thereby support on a shared signal processing hardware.

Further, carrier and timing recovery methods used for different digital TV and analog TV standards differ because for single carrier standards (e.g., ATSC) there is a suppressed pilot or analog TV standards which have colour and sound carriers. For Multi-carrier standards (like DVB-T, DVB-S, ISDB-T, CDMB-T etc) the received signal consists of multiple tones. For Cable standards (ITU-T J.83A/J.83B and J.83C) the transmitted signal is pilot-less. Thus the carrier/timing recovery scheme required for supporting multiple TV standards on a single chip would require different signal processing hardware. This inevitably leads to a much larger area and increased cost. For instance, a Television (TV) communication standard is considered as an example. Further, other communication standards include a 3G standard, a Wi-Fi standard, a LTE standard, a Bluetooth standard, or any other such standards are also having same drawbacks discussed in the TV standards.

Equalization methods used across different standards to overcome multipath environments are also radically different. While most of the multi-carrier (OFDM) based standards estimate channel impulse response using frequency domain analysis (like FFT) or a combination of time and frequency domain analysis, most of the single-carrier based standards require a time domain equalizer with variable feed-forward and feedback taps. Again such a huge difference makes it impossible to share the same resource in a hardware based implementation. Thus supporting multiple communication standards would need disparate hardware to be integrated thereby increasing area significantly.

SUMMARY

In view of the foregoing, an embodiment herein provides a Software Defined Radio (SDR) subsystem capable of supporting multiple communication standards for modulation and demodulation of an input signal. The SDR subsystem includes (i) a Signal Conditioning Cluster (SCC) unit (ii) a Signal Processing Cluster (SPC) unit and (iii) a Channel Codec Cluster (CCC) unit that performs a channel encoding and a channel decoding. The SCC unit (a) receives a baseband signal from the SPC unit and produces a digital Intermediate Frequency (IF) signal for the modulation and (b) receives an IF signal from a tuner and produces a complex baseband signal for the demodulation. The SPC unit (a) receives encoded bits from the CCC unit and produces the baseband signal for the modulation and (b) receives the complex baseband signal from the SCC unit and produces decision bits for the demodulation. The CCC unit (a) receives the input signal and produces the encoded bits the modulation and (b) receives the decision bits from the SPC unit and produces a decoded data for the demodulation. In one embodiment, the SCC unit (a) receives the baseband signal from the SPC unit and produces the digital Intermediate Frequency (IF) signal based on a first communication standard for a trans-modulation and (b) receives the IF signal from the tuner and produces the complex baseband signal based on a second communication standard for the trans-modulation. The SPC unit (a) receives the encoded bits from the CCC unit and produces the baseband signal based on the first communication standard for the trans-modulation and (b) receives the complex baseband signal from the SCC unit and produces the decision bits based on the second communication standard for the trans-modulation.

The multiple communication standards include analog and digital communication standards. The SCC unit further includes (i) a Digital Front End (DFE) unit, (ii) a plurality of Signal Conditioning (SCON) CPUs adapted to sample based signal processing and (iii) a memory sub system. The DFE includes a Numerically Controlled Oscillator (NCO) that operates at a sample-rate frequency and that performs a digital down-conversion of the IF signal into the complex baseband signal. The SCON CPU (a) perform a pulse shaping of the baseband signal from the SPC unit for the modulation and (b) perform a Finite Impulse Response (FIR) filtering, an Infinite Impulse Response (IIR) filtering, an interpolation, and a sample rate conversion filtering on the complex baseband signal from the NCO for the demodulation. The memory subsystem includes (i) a store-and-forward buffer or a cut-through buffer for storing the complex baseband signal or the baseband signal and (ii) a Direct Memory Access (DMA) unit that extracts data that corresponds to the complex baseband signal or the baseband signal from the store-and-forward buffer or the cut-through buffer based on a programmed threshold.

The SPC unit includes (i) a plurality of Signal Processing (SPROC) CPUs adapted for block based signal processing (ii) a Least Mean Squares (LMS) coprocessor that is coupled to the plurality of SPROC CPUs and (iii) a memory subsystem. The SPROC CPU (a) perform a modulation, a framing and a mapping on the encoded bits from the CCC unit to produce the baseband signal for the modulation of the input signal and (b) perform a demodulation, a channel estimation, a channel correction, and de-mapping of symbols on the complex baseband signal received from the SCC unit to produce the decision bits for the demodulation of the input signal. The Least Mean Squares (LMS) coprocessor performs an adaptive feedback and feed-forward FIR filtering, a coefficient or tap adaptation, and a high speed FIR filtering operation on multiple streams. The memory subsystem includes (i) an Inter-Cluster Buffer (ICB), (ii) a DMA unit that processes a transfer of a processed data to the CCC unit and (iii) a Shared Memory Subsystem (SHM) that is connected across the SPROC CPU. The SHM is used as a buffer for storing and exchanging of computed results between the SPROC CPUs. The SPROC CPUs includes (i) a complex arithmetic slot that performs at least one of real and complex arithmetic operations, wherein the operations include N-way Single Instruction Multiple Data (SIMD) operations, and (ii) a cordic slot that generates (i) sine and cosine values and (ii) magnitude and phases of complex signals, wherein the cordic slot is coupled to the LMS coprocessor to perform cycle efficient read and write operations during an equalizer operation. The complex arithmetic slot also supports Fast Fourier Transform (FFT) butterfly operations. The cordic slot further performs N-way arithmetic, logic and extract operations.

The CCC unit (a) receives the input signal and performs at least one of a viterbi encoding, a Reed Solomon (RS) encoding, and a Low-Density Parity-Check (LDPC) to produces the encoded bits for the modulation and (b) receives the decision bits from the SPC unit and performs at least one of a viterbi decoding, a Reed Solomon (RS) decoding, and a Low-Density Parity-Check (LDPC) to produces the decoded data for the demodulation.

In one aspect, a method for demodulating an input signal in software defined radio (SDR) subsystem is provided. The SDR subsystem is capable of supporting multiple communication standards. The method includes (i) receiving the input signal in a tuner and converting the input signal into one of a zero Intermediate Frequency (IF) signal, a low IF signal, and a standard IF signal (ii) converting the one of the zero IF signal, low IF signal and standard IF signal into a digital signal, (iii) down converting the digital signal into a complex baseband signal, (iv) performing a FIR filtering, an IIR filtering, an interpolation and a sample rate conversion filtering on the complex baseband signal to produce a filtered complex baseband signal using a Signal Conditioning CPU (SCON CPU) adapted for a sample based signal processing, (v) performing a demodulation, a channel estimation, a channel correction, and a de-mapping on the filtered complex baseband signal based on the multiple communication standards to obtain decision bits using a Signal Processing CPU (SPROC CPU) adapted for block based signal processing and (vi) performing at least one of a viterbi decoding, a Reed Solomon (RS) decoding, and a Low-Density Parity-Check (LDPC) decoding on the decision bits to obtain decoded data. Loading and storing of the complex baseband signal may be performed, using a load-store slot of the Signal Conditioning CPU (SCON CPU), to enable filtering operation. The FIR filtering, the IIR filtering, the interpolation and the sample rate conversion filtering may be performed using the filter slot of the SCON CPU on a complex baseband signal obtained from the load-store slot. Arithmetic operations required for filtering operation may be performed using an arithmetic slot of the SCON CPU. The demodulation, the channel estimation, the channel correction, and the de-mapping may be performed on the filtered complex baseband signal using a complex arithmetic slot and a cordic slot of the Signal Processing CPU (SPROC CPU).

In another aspect, a method for modulating an input signal in a software defined radio (SDR) subsystem that is capable of supporting multiple communication standards is provided. The method includes (i) performing at least one of a viterbi encoding, a Reed Solomon (RS) encoding, convolution encoding and a Low-Density Parity-Check (LDPC) encoding on the input signal to produce encoded bits, (ii) performing a modulation, a framing, and a mapping on the encoded bits based on the multiple communication standards to obtain baseband signals using a Signal Processing CPU (SPROC CPU) adapted for a block based signal processing, (iii) performing an up-conversion and a pulse shaping of the baseband signals to produce a digital IF signal using a Signal Conditioning CPU (SCON CPU) adapted for a sample based signal processing and (iv) converting the digital IF signal into an analog signal. The modulation, the framing and the mapping may be performed on the encoded bits using a complex arithmetic slot and a cordic slot of the Signal Processing CPU (SPROC CPU). The up-conversion and the pulse shaping of the baseband signals may be performed using a load-store slot, a filter slot, and an arithmetic slot of the Signal Conditioning CPU (SCON CPU).

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
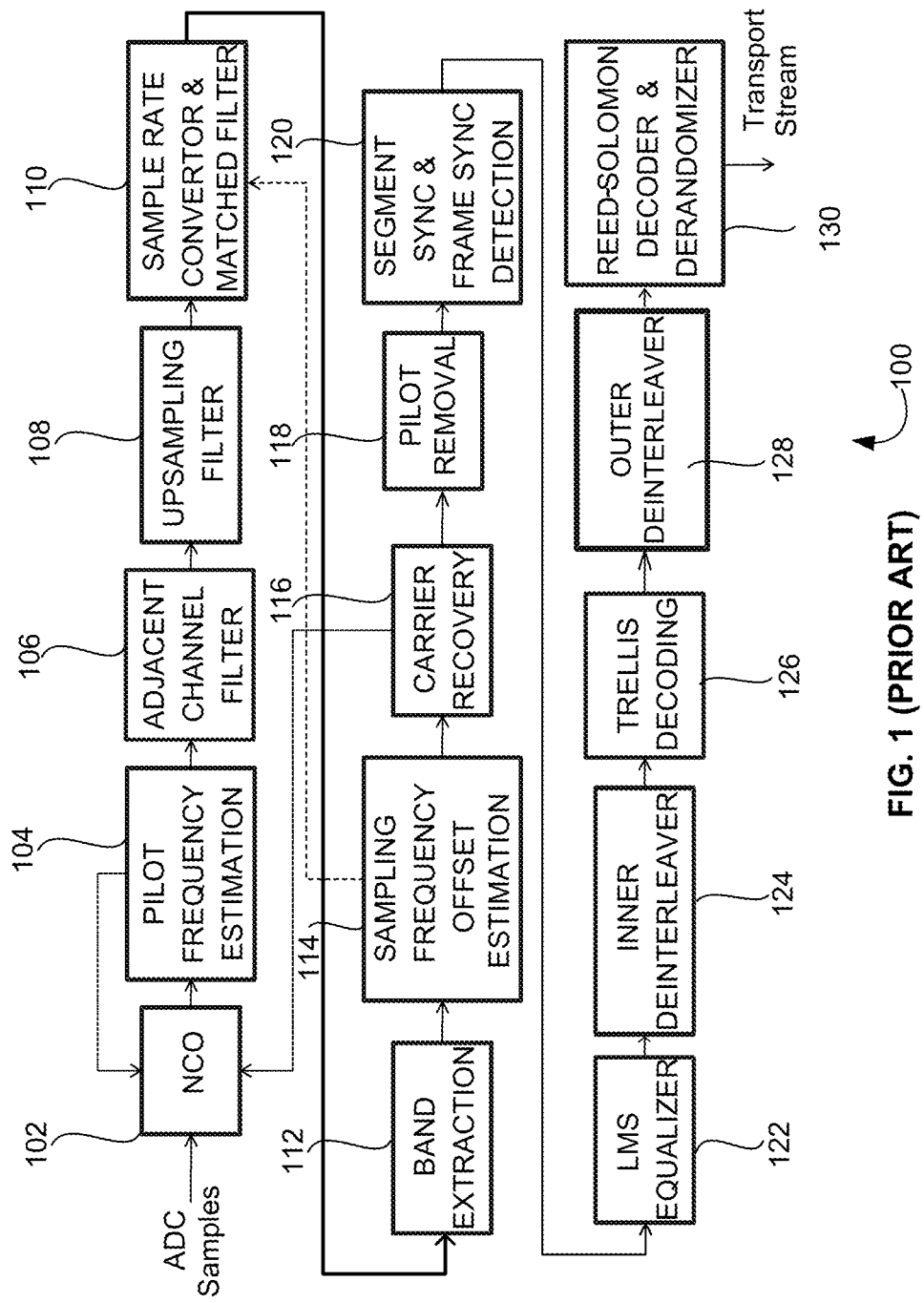
FIG. 1 illustrates a typical ATSC demodulation signal chain.
Figure 2:
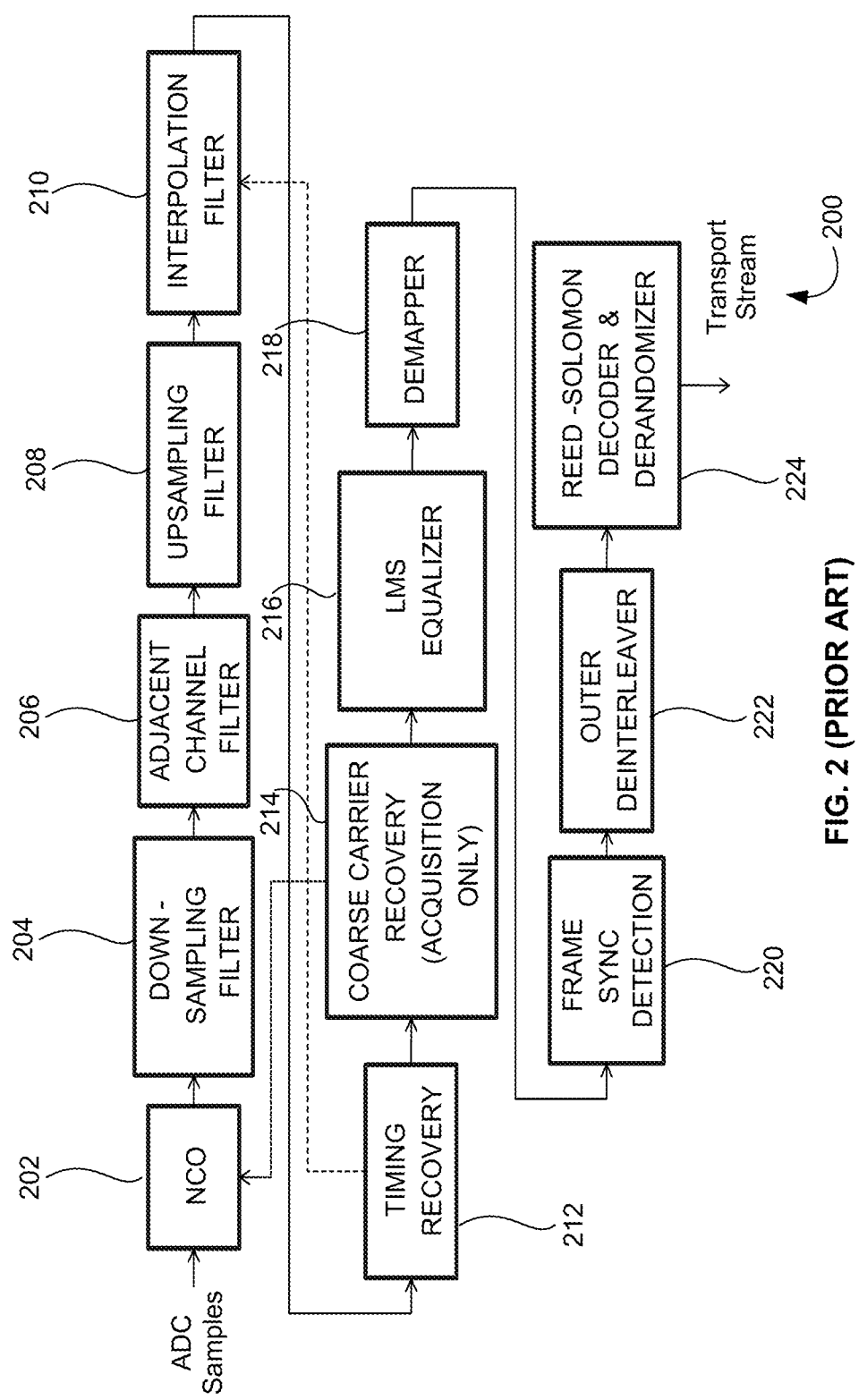
FIG. 2 illustrates a typical cable demodulation (J.83A and J.83C) signal chain.
Figure 3:
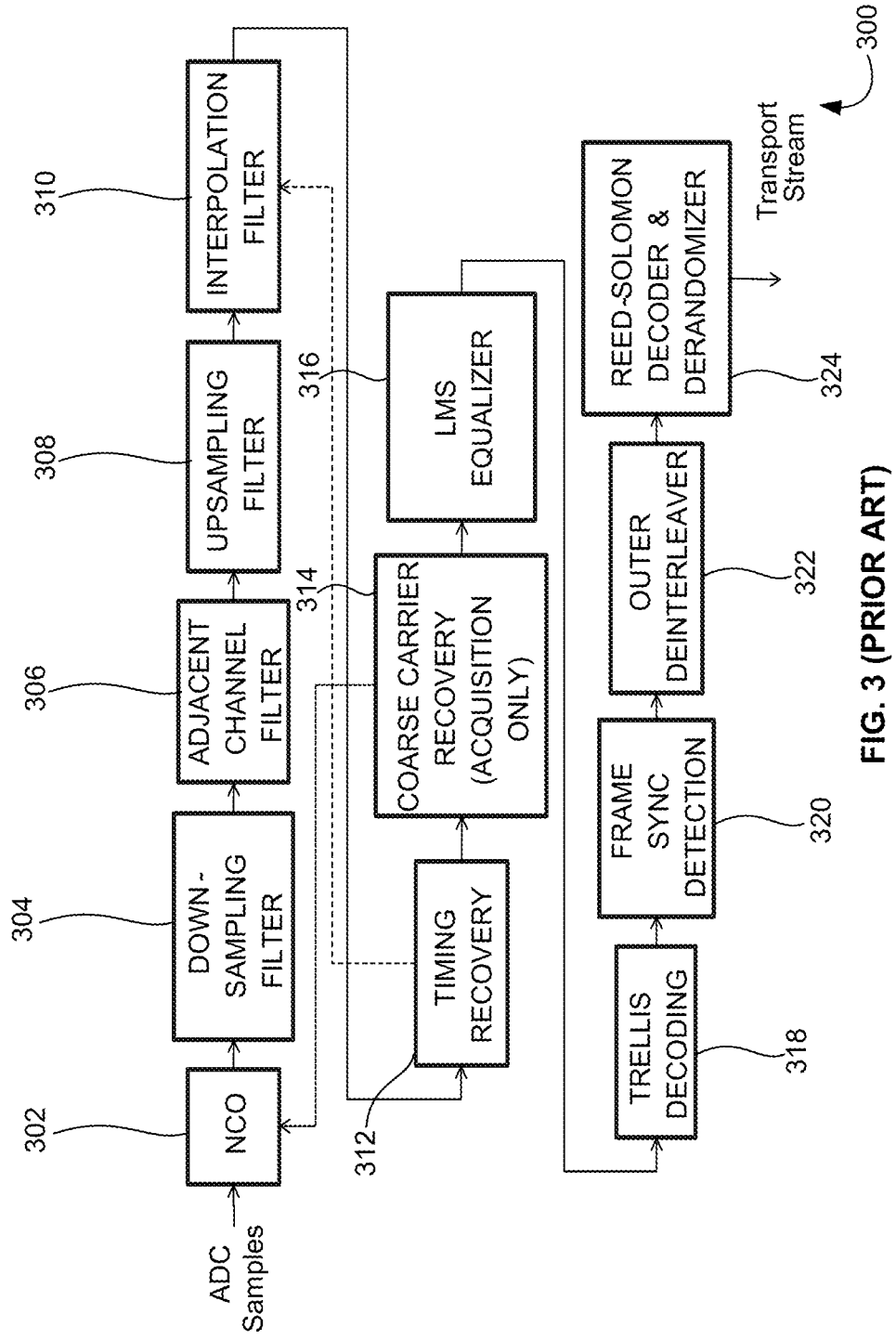
FIG. 3 illustrates a typical cable demodulation (J.83B) chain.
Figure 4A:
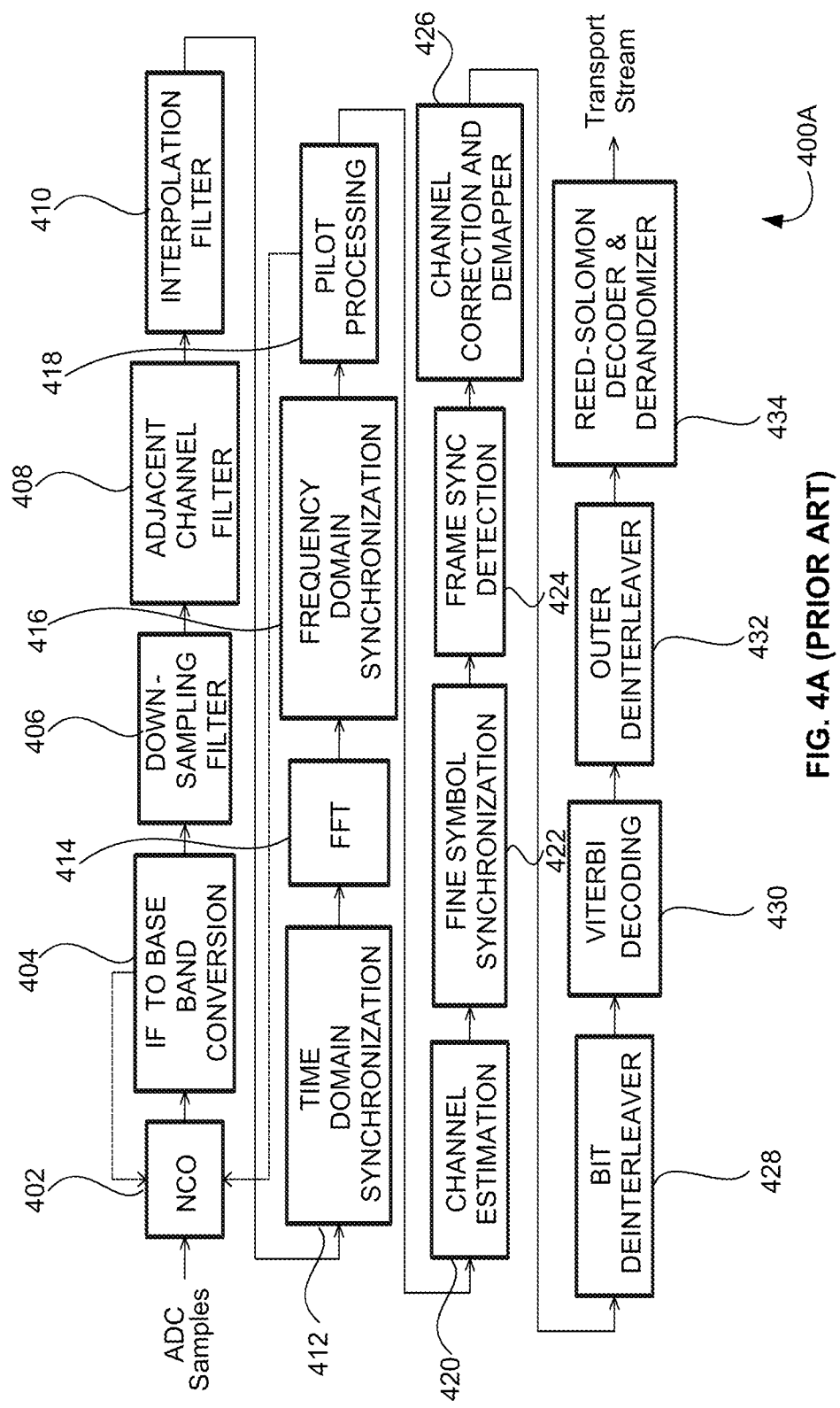
FIG. 4A illustrates a typical DVB-T demodulation chain.
Figure 4B:
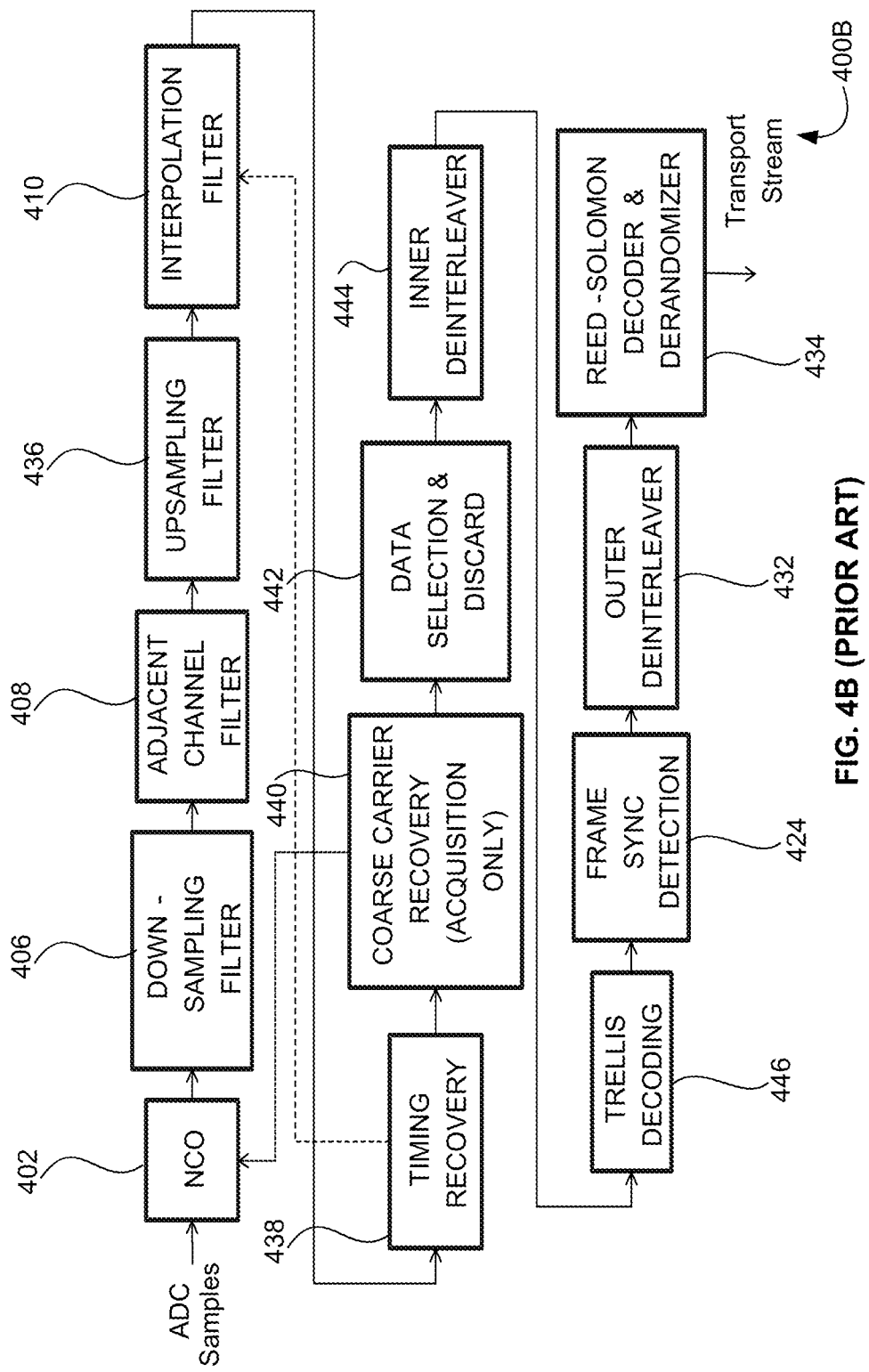
FIG. 4B illustrates a typical DVB-S demodulation chain.
Figure 5:
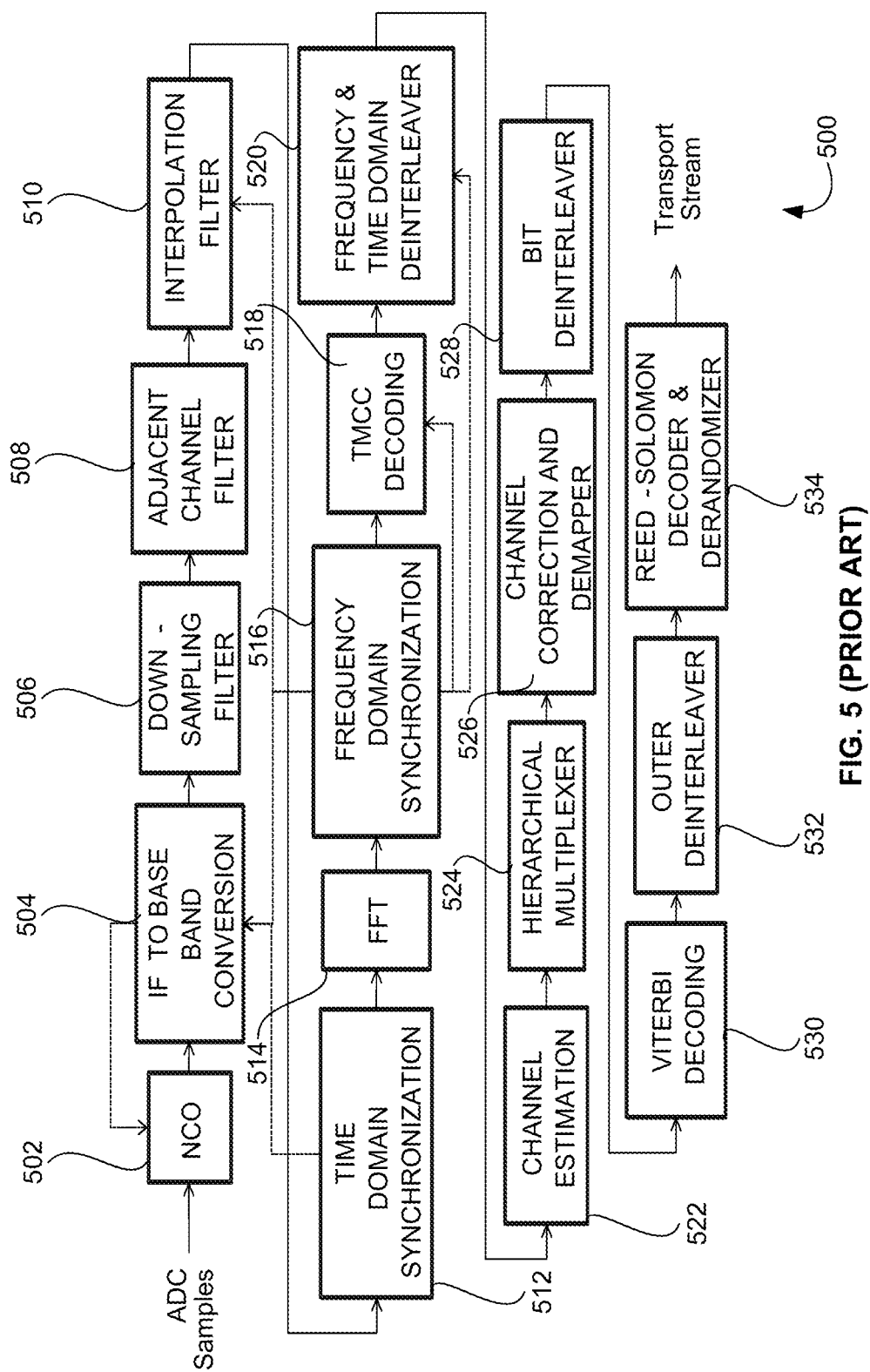
FIG. 5 illustrates a typical ISDB-T demodulator chain.
Figure 6:
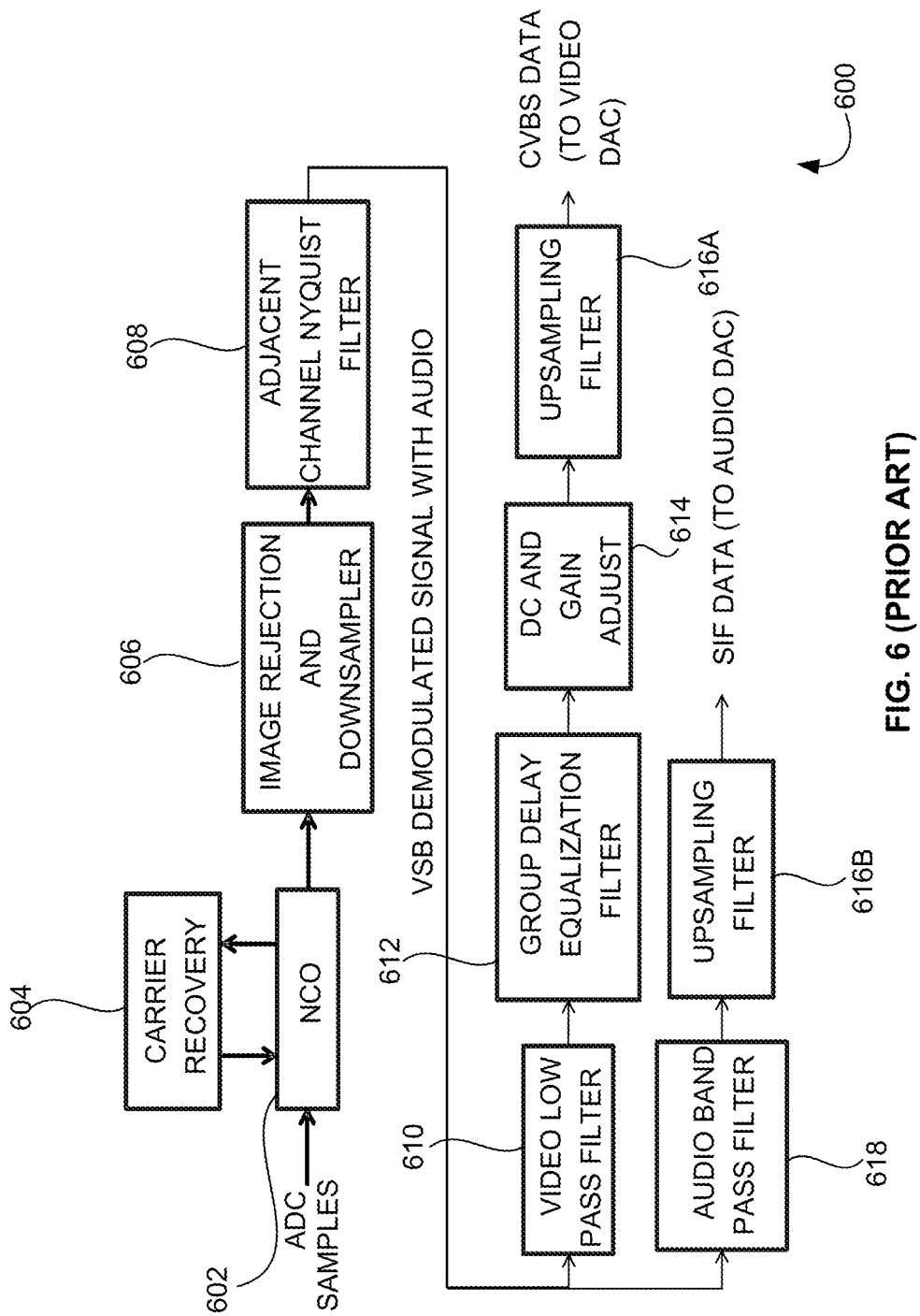
FIG. 6 illustrates a typical analog TV signal demodulation chain.
Figure 7:
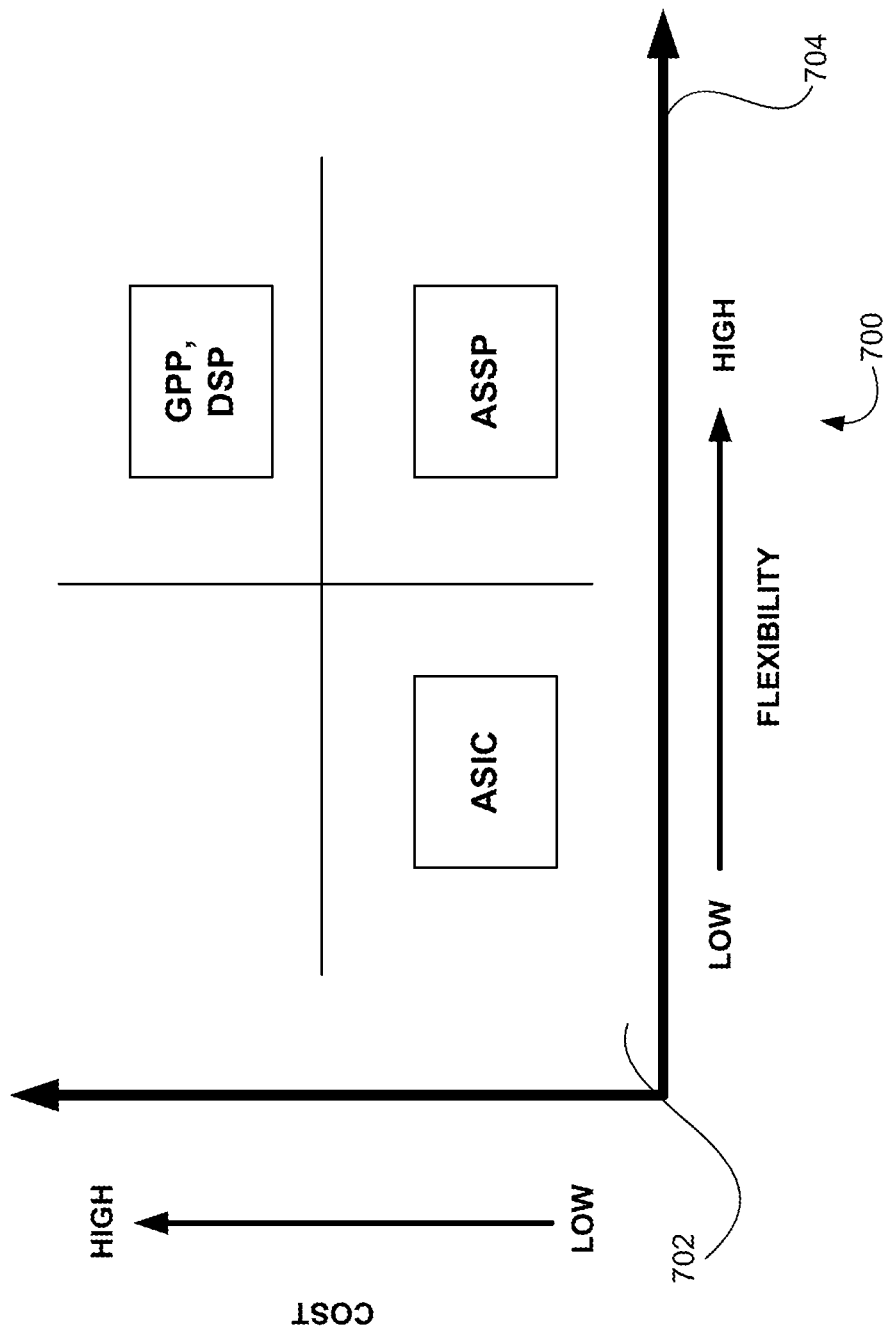
FIG. 7 illustrates a cost versus flexibility for different architectures.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a Software Defined Radio (SDR) subsystem that is capable of performing a modulation, a demodulation or a trans-modulation of digital and analog signals covering different mediums like cable, terrestrial, satellite and radio standards. The embodiments herein achieve this by providing the modulation, the demodulation or the trans-modulation of digital as well as analog signals using a software defined radio subsystem. Referring now to the drawings, and more particularly to FIGS. 8 through 24, where similar reference characters denote corresponding features consistently throughout the figures, preferred embodiments are described herein.

Figure 8:
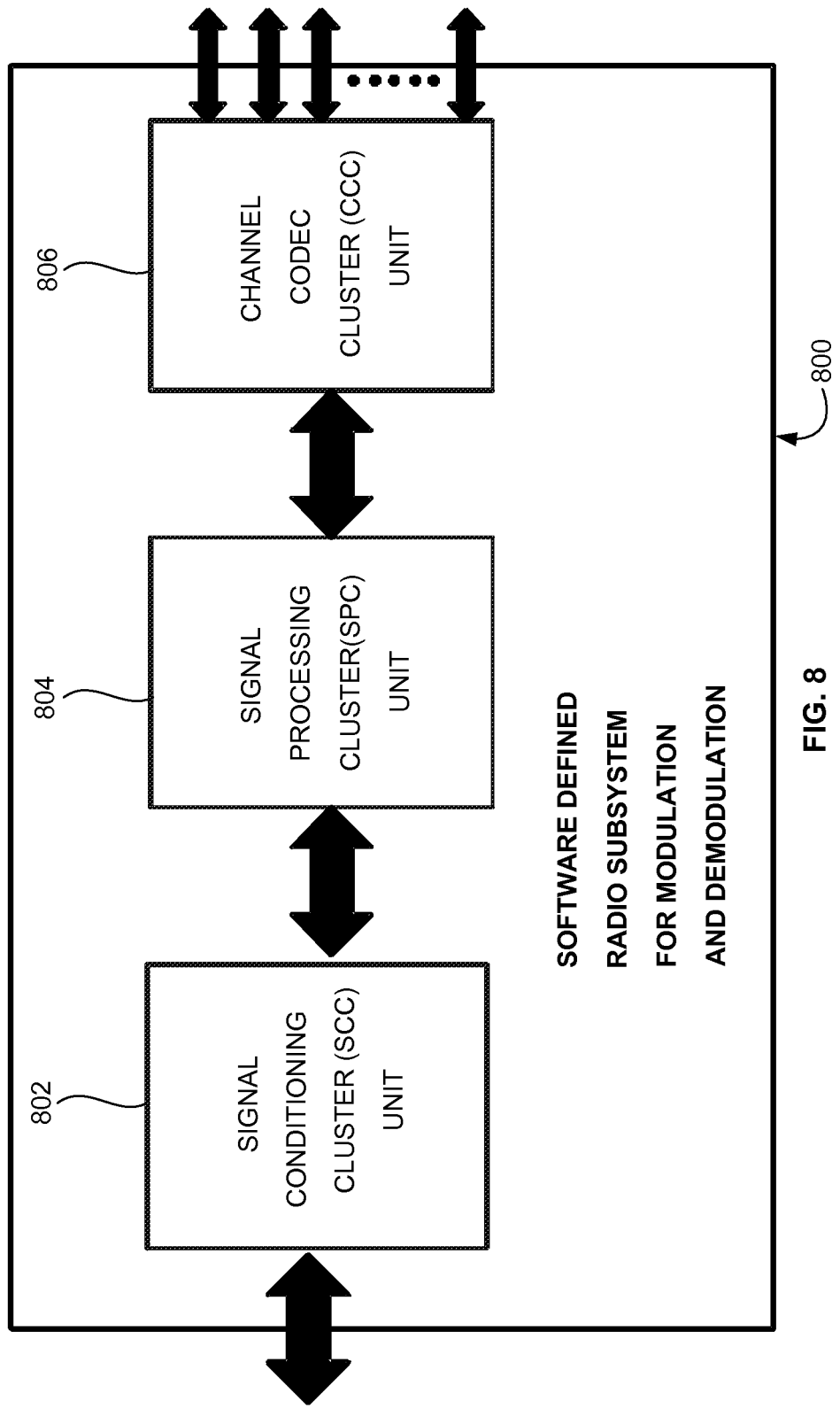
FIG. 8 illustrates a top level architecture of a software defined radio (SDR) subsystem for universal modulation, demodulation or trans-modulation according to an embodiment herein.

FIG. 8 illustrates a top level architecture diagram of a software defined radio (SDR) subsystem 800 for modulation, demodulation or trans-modulation of input signals according to embodiment herein. The SDR subsystem 800 is capable of supporting multiple communication standards that includes a multiple analog and digital communication standards. The SDR subsystem 800 includes (i) a signal conditioning cluster (SCC) unit 802, (ii) a signal processing cluster (SPC) unit 804 and (iii) a channel codec cluster (CCC) unit 806. The SCC unit 802 includes a signal conditioning CPU (SCON CPU) that is adapted for a sample based signal processing. The SPC unit 804 includes a signal processing CPU (SPROC CPU) which is adapted for a block based signal processing.

During the modulation, the CCC unit 806 performs a channel encoding operation on a packetized data to produce encoded bits. The SPC unit 804 (a) receives the encoded bits and performs a mapping of encoded bits to a baseband signal, (b) a framing operation that inserts data and carrier into the baseband signal, and (c) performs modulation on the baseband signal based on multiple analog and digital communication standards. The SCC unit 802 receives a baseband signal and performs an up-conversion and pulse shaping of a modulated baseband signal to produce a digital Intermediate Frequency (IF) signal.

During the demodulation, the SCC unit 802 receives an Intermediate Frequency (IF) signal from tuner and down-converts into a complex baseband signal and also performs a Finite Impulse Response (FIR) filtering, an Infinite Impulse Response (IIR) filtering, an interpolation, a sample rate conversion filtering on the complex baseband signal. The SPC unit 804 receives the complex baseband signal and performs a demodulation, a channel estimation, a channel correction and de-mapping to produce a decision bits. The CCC unit 806 unit performs a channel decoding operation on the decision bits to produce decoded bits.

During the trans-modulation, the SDR subsystem is capable of modulating the input signal in one communication standards among the multiple communication standards and capable of demodulating the input signal in another communication standard. For instance, a Television (TV) communication standard is considered as an example.

Figure 9:
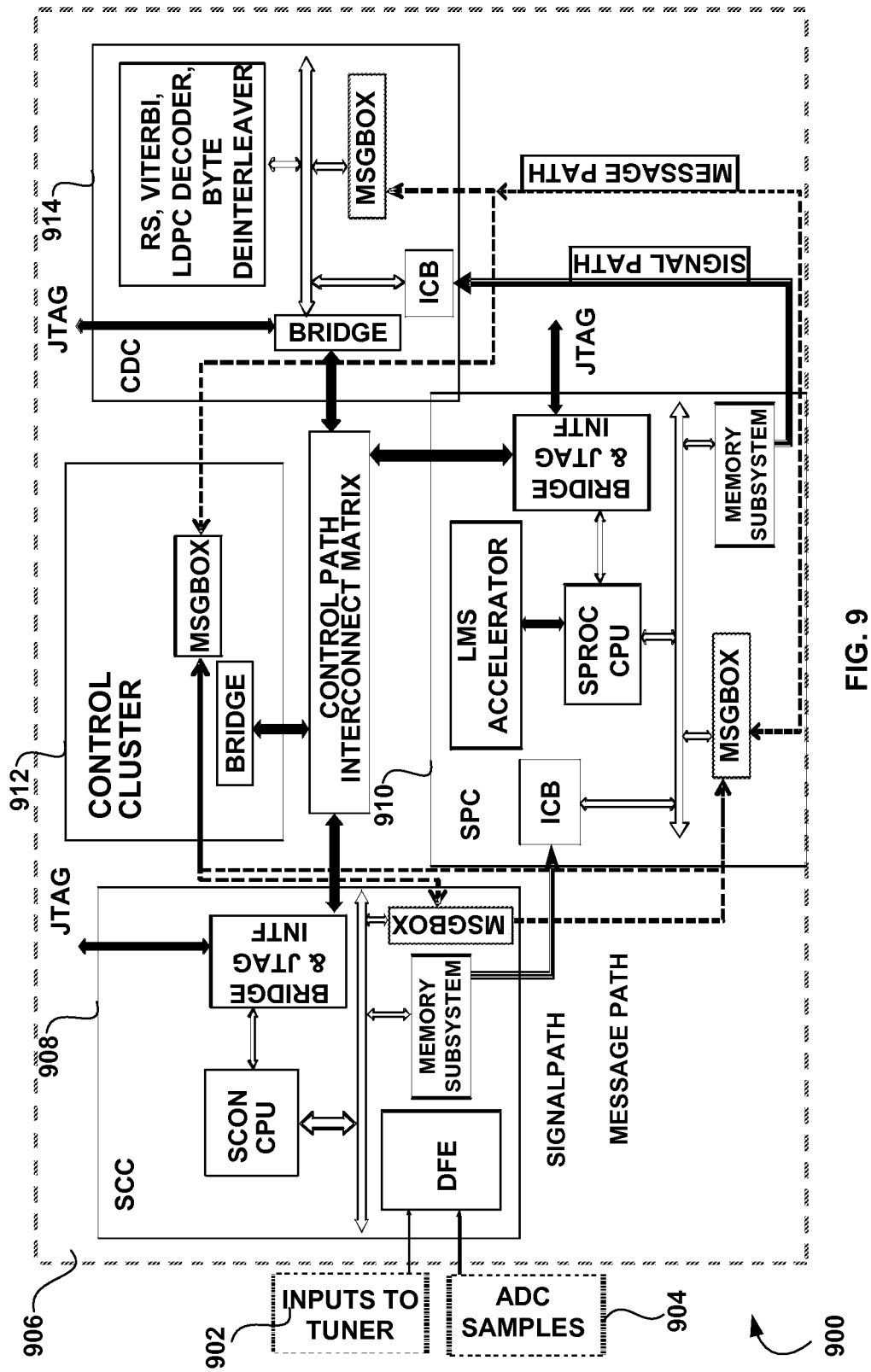
FIG. 9 illustrates an architecture of a software defined radio (SDR) receiver system that includes the software defined radio subsystem of FIG. 8 for universal TV signal demodulation according to an embodiment herein.

FIG. 9 illustrates architecture of a software defined radio (SDR) receiver system 900 for universal TV signal demodulation according to an embodiment herein. The SDR receiver system 900 includes (i) a tuner 902, (ii) an Analog to Digital Converter (ADC) 904 and (iii) a software defined radio subsystem 906 (e.g., the software defined radio subsystem of FIG. 8). The software defined radio subsystem 906 includes (i) a signal conditioning cluster (SCC) unit 908, (ii) a signal processing cluster (SPC) unit 910, (iii) a control cluster unit 912, and (iv) a channel decoding cluster unit 914. The SCC unit 908 performs digital down-conversion from Intermediate Frequency (IF) rate samples to symbol-rate samples. The SCC unit 908 may include (i) one or multiple signal conditioning CPUs (SCON CPU) which is adapted for a sample based signal processing, (ii) a digital front end (DFE), (iii) a memory subsystem that includes a SCC FIFO, and a SCC-DMA block. A message box (MSGBOX) is used to interact with other CPU Clusters. A programmable interrupt controller (PIC) is used to interface to interrupts generated on chip from same or different clusters. The SCC unit 908 interfaces to the control cluster unit 912 via a bridge and to an inter-cluster buffer (ICB) memory of the SPC unit 910 via a DMA. For instance, a Television (TV) signal receiver is considered as an example.

The SPC unit 910 may include (i) one or more LMS accelerators (a LMS coprocessor), (ii) a plurality of signal processing CPUs (SPROC CPUs) which is adapted for a block based signal processing and (iii) a memory subsystem that includes an inter-cluster buffer (SPC-ICB), a shared memory buffer (SPC-SHMB), a packing buffer, and SPC-DMA block. The SPC unit 910 performs one or more tasks such as symbol synchronization, a channel estimation, a channel correction and a demapping to bits to produce a decision bits. In one embodiment the decision bits may be a hard decision bits or soft decision bits. The SPC unit 910 receives the samples in the inter-cluster buffer to be used for further processing. The SPC unit 910 interfaces to the control cluster unit 912 via a bridge to the Inter-cluster buffer (ICB) memory of the Channel Decoding cluster unit 914 via a DMA block.

The overall scheduling and control of the entire software defined radio subsystem 906 is performed by the control cluster unit 912 which includes a general purpose processor with some general purpose peripherals such as a UART, a 2-wire interface and/or a boot ROM. The control cluster unit 912 accesses all individual clusters via the bridge. The channel decoding cluster unit 914 performs the tasks of a viterbi decoding, a Reed Solomon (RS) decoding, and a LDPC decoding along with a byte deinterleaver. The decoded data is finally pushed out as transport stream data in case of Digital TV Standards or CVBS and SIF stream in case of Analog TV Standards to interface to an on-chip/off-chip Digital to Analog Converter (DAC).

Figure 10:
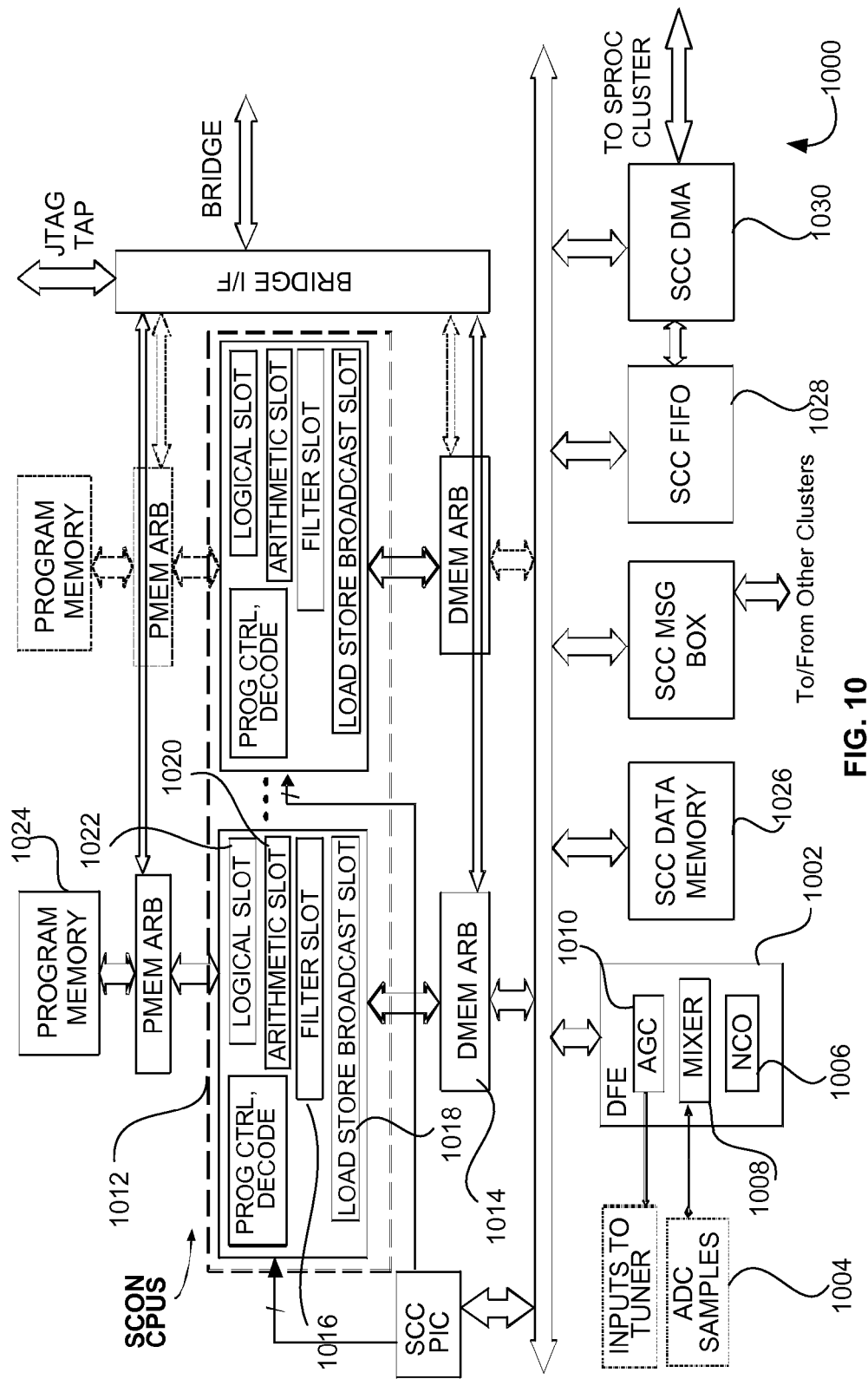
FIG. 10 illustrates an exploded view of the signal conditioning cluster of FIG. 9 according to an embodiment herein.

FIG. 10 illustrates an exploded view of the signal conditioning cluster unit 908 of FIG. 9 according to an embodiment herein. In particular, FIG. 10 illustrates how the signal conditioning cluster unit 908 is adapted for a sample based signal processing of signals. Signal conditioning cluster unit 1000 includes (i) a digital front end 1002, (ii) an input to receive ADC samples 1004, (iii) one or more SCON CPUs 1012, (iv) a memory data bus and arbiter 1014, (v) a program memory 1024, (vi) a SCC data memory 1026, (vii) a SCC FIFO 1028 and (viii) a SCC-DMA 1030. The digital front end 1002 includes (a) a numerically controlled oscillator (NCO) 1006, (b) a mixer 1008, and (c) an automatic gain control (AGC) circuitry 1010. The digital front end 1002 receives samples obtained by digitizing the incoming intermediate frequency signal from analog-to-digital converter (ADC) samples input 1004. The numerically controlled oscillator 1006 operates at a sample-rate frequency.

The mixer 1008 obtains a digitally synthesized waveform from the NCO 1006 and down-converts the IF signal to a baseband signal. The automatic gain control (AGC) circuitry 1010 ensures that the full-scale range of the analog to digital converter is used effectively. The digital front end 1002 includes an internal FIFO storing incoming sample converted to baseband. The signal conditioning CPUs 1012 may include (i) a filter slot 1016, (ii) a load-store broadcast slot 1018, (iii) an arithmetic slot 1020, and (iv) a logical slot 1022. In one embodiment, the signal conditioning CPU 1012 is capable of interfacing a high speed streaming input samples and implements a FIR filtering, an IIR filtering, and sample rate conversion filters.

In addition, the SCON CPU 1012 also performs carrier synchronization by implementing PLL's in software. The SCON CPU 1012 also performs the task of IQ imbalance correction when input samples are obtained from IQ ADC. The SCON CPU 1012 has a program memory 1024 which interfaces via the program memory interface. The SCON CPUs 1012 interfaces with its dedicated data memory signal conditioning cluster (SCC) data memory 1026, the digital front end 1002, the SCC FIFO 1028 and the SCC DMA 1030 through a data memory interface. The digital front end (DFE) 1002 interfaces with the SCON CPUs 1012 as a memory-mapped device on the digital memory data bus 1014.

The filter slot 1016 is capable of performing real multiply and real MAC operations (with 64 MACs). The filter slot 1016 includes one or more MAC unit that are capable of performing high sample rate FIR filtering and IIR filtering, a decimation operation, an Interpolation, a down-sampling and Up-sampling operation.

The load-store broadcast slot 1018 is capable of performing 128 bit or 8×16 bit sample load-store operations. To support interpolation features there is a load with extract feature which enables retention or rejection of samples from previous load operations and concatenation with incoming loaded samples. The arithmetic slot 1020 is capable of performing basic arithmetic functions such as an addition operation, a subtraction operation, an absolute finding operation, an exponent calculation and swapping of IQ pair of complex signals operation. In addition, the arithmetic slot 1020 also processes accumulator values either by a horizontal addition with post-scaling or just by moving scaled accumulator values into one or more general purpose registers. The logical slot 1022 is capable of supporting basic logical operations such as one or more Boolean operations and Compare operations.

The program memory 1024 is 128 bits wide. The bridge is used at a boot-up time to download each CPU's code into its program memory 1024. The bridge interface is used for transferring control information from a control CPU in the control cluster unit 912 to the SCC unit 908. The SCC data memory bus and arbiter 1014 is a 128-bit wide bus internal to the SCC unit 908 through which the SCON CPUs 1012 and the bridge (e.g., shown as bridge i/f in FIG. 10) may access slaves on the data memory bus. The slaves on this bus are a SCC data memory 1026, a DFE 1002, a SCC FIFO 1028, and a SCC-DMA 1030. The SCON program memory bus (e.g., shown as PMem Arb in FIG. 10) is 128 bits wide.

After completion of processing by the SCON CPUs 1012, the data is written by the SCON CPUs 1012 over DMEM bus 1014 to the SCC FIFO 1028. The SCC FIFO 1028 serves either as a store-and-forward or as a cut-through buffer. The SCC FIFO 1028 is a 256 bit wide bus with programmable depth. Data is pushed into the SCC FIFO 1028 by writing to its push-address by the CPU. The attached DMA engine (i.e., a SCC-DMA 1030) pops out data from the SCC FIFO 1028 through a dedicated interface independent of data memory bus 1014 when a programmed threshold is reached.

The signal conditioning cluster DMA (SCC-DMA) 1030 is programmed and enabled to perpetually execute data transfers without any need for reprogramming. This is customized to handle bank-based and circular nature of an inter-cluster buffer. Before starting to write a new bank of data, the SCC-DMA 1030 first sends a bank request to the inter-cluster buffer and waits to receive a confirmation for that bank from the signal processing cluster-inter-cluster buffer. When the SCC FIFO 1028 indicates that it is ready with a block of data, the SCC-DMA 1030 starts reading from the SCC FIFO 1028 and writes it into sequential addresses of the Inter-cluster buffer in Signal Processing Cluster.

The SCC-DMA 1030 further samples the SCC FIFO 1028 ready status when it has completed the programmed transfer count (DMA Count) number of double-words. When a bank boundary is reached, the SCC-DMA 1030 communicates the status of current bank to the ICB (inter-cluster buffer) and requests for a next bank. The SCC-DMA 1030 is programmed with information about the range of ICB addresses over which it needs to maintain circularity. The SCC-DMA 1030 assumes the size of each bank as a predefined size to determine when a bank crossover occurs. Associated with the SCON CPUs 1012 is a message box (e.g., shown as SCC MSGBOX in FIG. 10) which allows the SCON CPUs 1012 to exchange single word (32 bit) messages with each of the other CPU's in different clusters. The message box includes a collection of registers and is connected to the DMEM bus 1014 of the SCC unit 908. The message box receives messages in its Inbox from all other CPU's and sends messages to other CPU's via Outbox. The SCC unit 908 includes a programmable interrupt controller (SCC PIC) which aggregates multiple source events into two levels of interrupts (INT1, INT2) and an exception (EXCP) for the SCON CPUs 1012.

Figure 11:
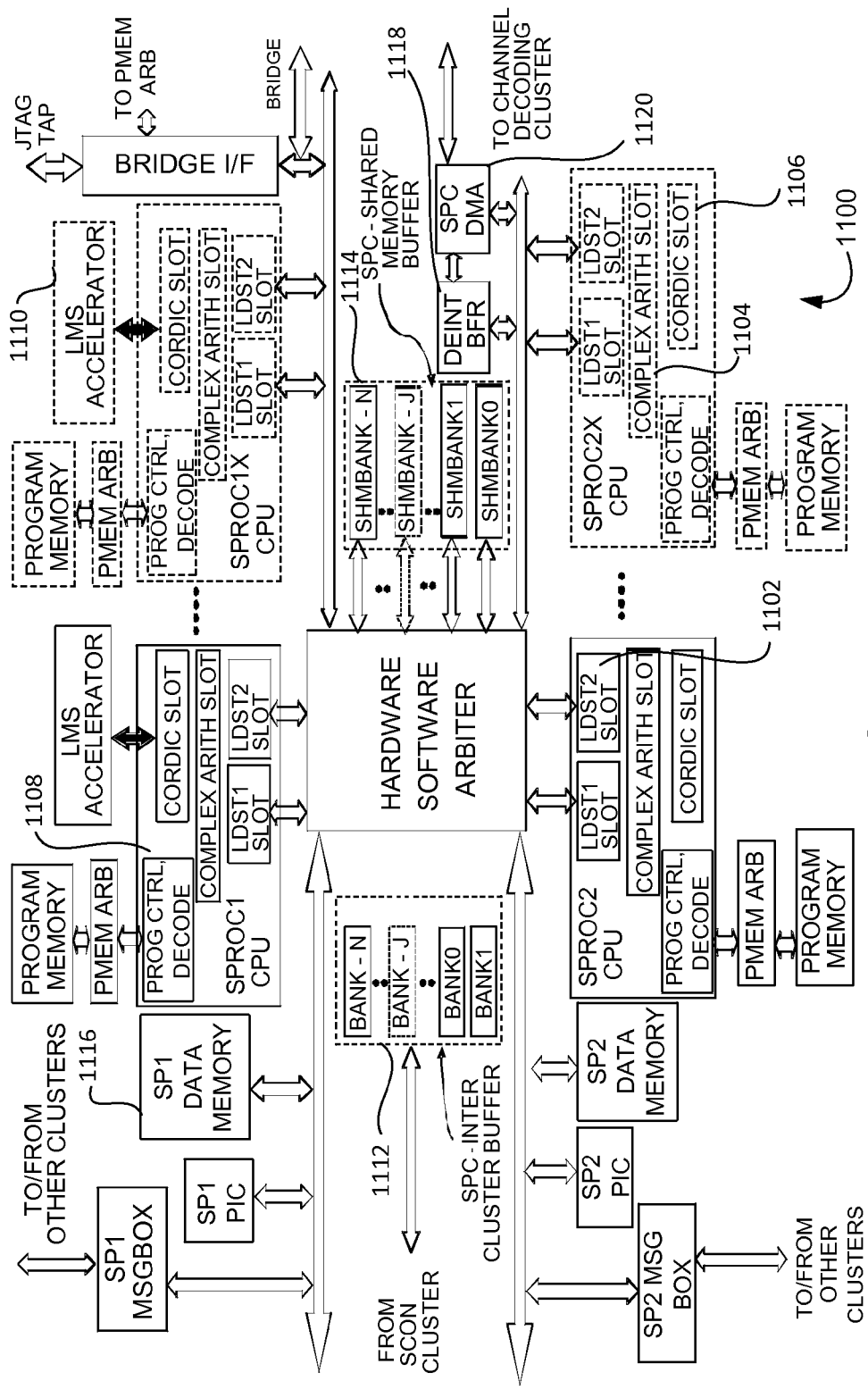
FIG. 11 illustrates an exploded view of the signal processing cluster of FIG. 9 according to an embodiment herein.

FIG. 11 illustrates an exploded view 1100 of the signal processing cluster unit 910 of FIG. 9 according to an embodiment herein. In particular, FIG. 11 illustrates how the signal processing cluster unit 910 is adapted for a block based signal processing of signals. The signal processing cluster unit 910 is capable of handling complex arithmetic computations such as a complex MACs operation, a complex multiplication operation and is further capable of handling large (8192, 4096 or 2048-point) FFT's including non-power of 2, a prime factor DFT computation, etc. In OFDM based standards, a signal processing CPUs (SPROC CPUs) 1108 are used for performing symbol synchronization, a channel impulse response interpolation, a symbol de-interleaving and de-mapping. The SPROC CPUs 1108 include one or more execution slots (e.g. 4 execution slots) such as (i) a complex arithmetic slot 1104, (ii) a cordic slot 1106, and (iii) two 64-bit load-store slots 1102.

Special instructions for dividing complex signal by a real signal and Single depth trace-back for viterbi decoding are provided for channel estimation. The load-store slots 1102 are capable of 64 bit load and store operations. They support linear, circular and bit-reverse addressing. In one embodiment, few registers are marked in the register file as address pointers. In addition to load-store operations, the load-store slots 1102 are also capable of performing boolean, compare and extract operations. Additionally, the load-store slots 1102 are capable of executing arithmetic operations such as ADD, SUB and 2-way or 4-way SIMD variants of ADD and SUB operations.

The 2 load-store slots 1102 ensure that a high bandwidth memory interface is required for all symbol processing tasks. The complex arithmetic slot 1104 is capable of performing operations on complex signals. It supports complex multiply, complex conjugate multiply, complex MAC, real multiply, real MAC and real multiply and add operations. These operations may include either 2-way or 4-way SIMD operations. The complex arithmetic slot 1104 also supports very efficient FFT butterfly operations which enable low cycle count FFT operations. To enable division operations required by the channel equalizer, the complex arithmetic slot 1104 supports operations such as a 1-way or a 2-way SIMD complex number divided by a real number.

The cordic slot 1106 is capable of generating twiddle factors (e.g., sine and cosine operations) as well as non-normalized magnitudes and phases of complex signals. The cordic slot 1106 is tightly coupled with the LMS coprocessor 1110 which enables to perform a cycle efficient read and write operations during equalizer operation. The cordic slot 1106 also performs logic, extract, shift, packed extract, packed shift and single or multi-way add, subtract, add-subtract paired operations. The LMS coprocessor 1110 is a compute engine used for channel estimation in digital TV standards and high speed FIR filtering in analog TV Standards. It has efficient hardware structures to perform adaptive feedback and feed-forward FIR filtering, coefficient/tap adaptation based on least-mean-squared algorithm, and high speed FIR filtering operations on multiple streams.

The LMS coprocessor 1110 interfaces to the SPROC CPUs 1108 through either of the load-store slots 1102 (or Bridge) for a transfer of configuration parameters and a tightly coupled register-like interface for transfer of sample update and reading back the result value. A signal processing cluster inter-cluster buffer 1112 is a bank-based memory with wide data width meant for continuous transfer of processed signal from the signal conditioning cluster unit 908 to be consumed by the signal processing cluster unit 910. The signal processing cluster inter-cluster buffer bank 1112 can be written by signal conditioning cluster DMA (one bank at a time) and can be read (multiple banks at a time) by one of the signal processing cluster CPUs 1108. Banks are contiguous in address space and are used in a circular mode by signal conditioning cluster DMA because it is provided for transferring continuous signal data.

The inter-cluster buffer bank 1112 is used in a linear or a circular mode depending on the signal conditioning cluster DMAs parameters. Once programmed, the signal conditioning cluster DMA can carry on writing perpetually. The signal conditioning cluster DMA also incorporates a mode where it stops after transfer of a programmable block of data. A combination of hardware and soft-arbitration techniques are used for accessing the banks in the signal processing cluster inter-cluster bank 1112 amongst the different available masters like DMA, bridge and signal processing cluster CPUs. An error interrupt can be triggered if a non-owner tries to access a bank.

A signal processing cluster shared memory buffer 1114 is a bank-based buffer with a wide data path meant for storage and exchange of computed results between signal processing cluster CPUs 1108. Since the access paths to bridge are also required they could also have similar types of access schemes. There are specific registers for programming a signal processing cluster DMA (SPC-DMA) 1120, a deinterleaver buffer (DEINT BFR) 1118, and to select between different signal processing CPUs 1108 for ownership of the shared memory banks, to ensure that only one CPU has exclusive access. The access to the SPC Shared Memory buffer (SHM) 1114 and CPU-exclusive slaves (PIC, MSGBOX) are arbitrated between the SPROC CPUs 1108 and Bridge either using priority based or round-robin algorithms.

A signal processing data memory 1116 is used as a local memory by the SPROC CPUs 1108. The deinterleaver buffer 1118 assists in a data packing operation to be performed on data written by a SPROC CPUs 1108 before it is transferred by SPC-DMA 1120 to a channel decoding cluster. Specific packing modes for different digital TV standards (like ATSC, DVB-T, ISDB-T and CDMB-T) and analog TV modes exist, which are programmed using configuration registers. The packing buffer accepts data of a certain programmed data width from signal processing CPUs 1108 in a non-sequential order.

SPC-DMA 1120 waits for an indication that data block is ready along with the block size from deinterleaver buffer after which it transfers data to Inter-cluster buffer of channel decoding cluster unit 914. Here the channel decoding cluster unit 914 consists of accelerators performing the tasks of a viterbi and TCM decoder, a Reed Solomon (RS) decoder and a LDPC Decoder. In addition the byte deinterleaver is also present in this cluster. These processes act on the data in various phases as inner decoder and outer decoder. Additional processes such as an inner deinterleaver, an outer deinterleaver and a de-randomizer etc. are monitored in the channel decoding cluster unit 914.

The decoded data is finally collected in the transport stream output block. This contains a ping-pong buffer that accepts packets of transport stream after channel decoding steps are complete and sends them out in 8-bit parallel or serial mode outputs. In case of analog TV standards the processed data from the SPC unit 910 is bypassed through the channel decoding cluster unit 914. The video data (CVBS) is appropriately routed to the Video DAC and the audio data (SIF) is appropriately routed to the SIF DAC.

Figure 12:
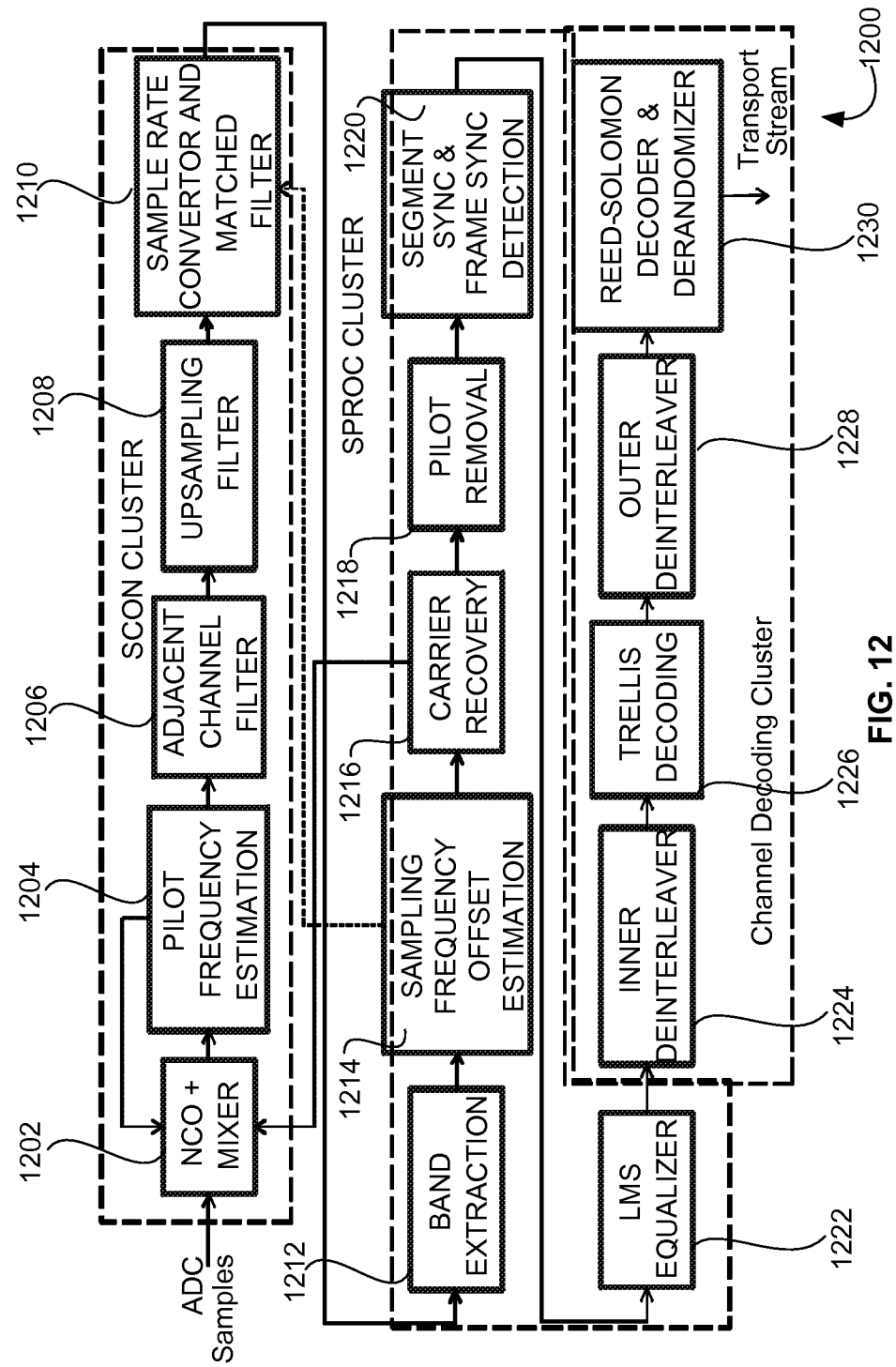
FIG. 12 illustrates a mapping of a ATSC demodulation on the software defined radio subsystem of FIG. 9 according to an embodiment herein.

FIG. 12 illustrates a mapping 1200 of ATSC demodulation on the SDR subsystem 906 of FIG. 9 on the different clusters according to an embodiment herein. The NCO 1202 and mixer operation is followed by a pilot frequency estimation 1204, an adjacent channel filtering 1206, an up-sampling 1208, a sample rate conversion and matched filters 1210. All are performed on the SCC unit 908. A band extraction 1212, a sampling frequency offset estimation 1214, a carrier recovery 1216, a pilot removal 1218, a segment sync detection and frame sync detection 1220 are performed on the SPC unit 910. A LMS equalizer 1222 is responsible for a channel equalization. The remaining processes constituting an inner deinterleaver 1224, a trellis decoding 1226, an outer deinterleaver 1228, a Reed-solomon decode and de-randomizer 1230 are expected to be performed in the channel decoding cluster unit 914. The final transport stream packets are created using a TSO module to be sent to a media processor.

Figure 13:
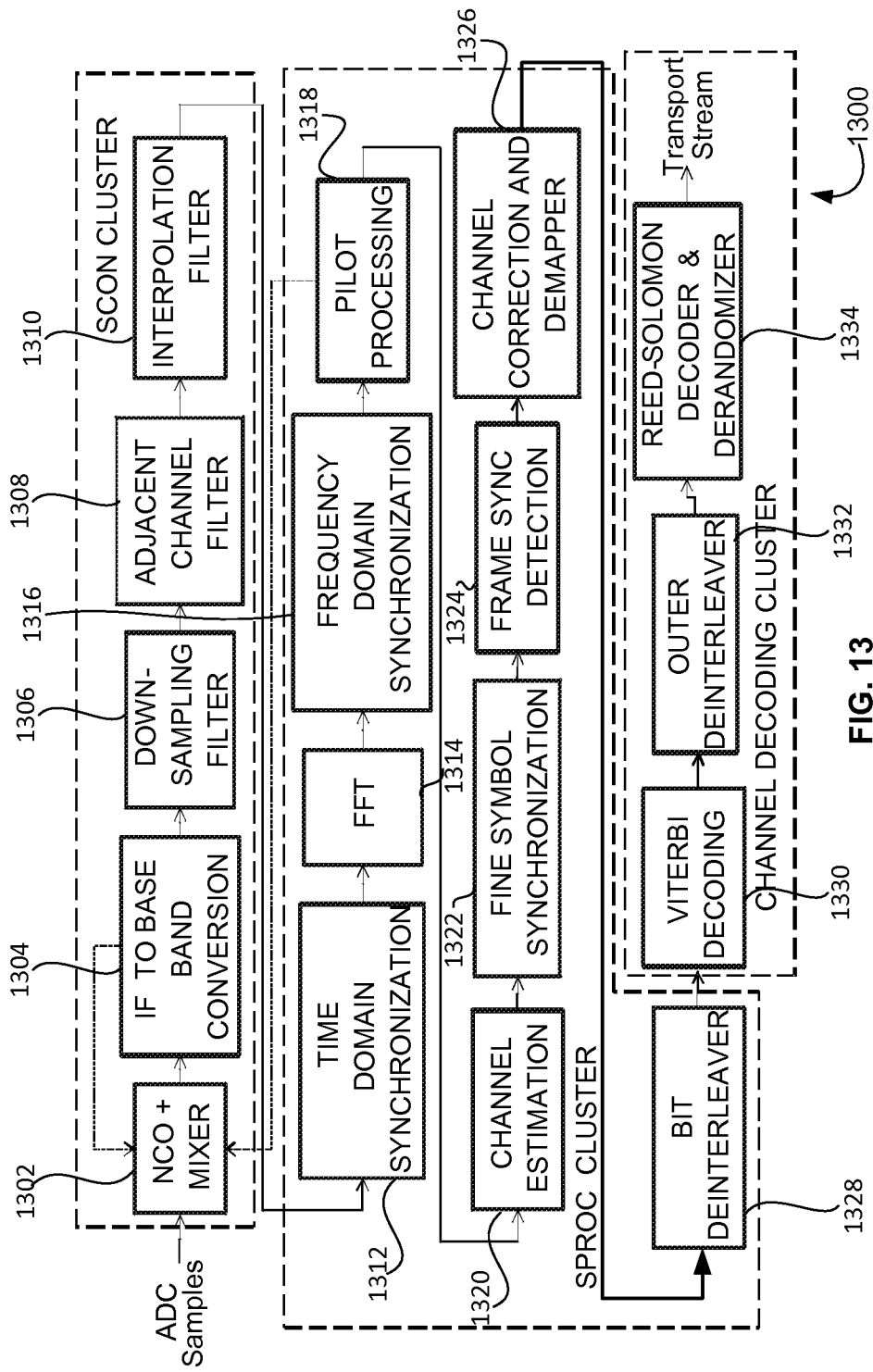
FIG. 13 illustrates a mapping of a DVB-T demodulation on the software defined radio subsystem of FIG. 9 according to an embodiment herein.

FIG. 13 illustrates a mapping 1300 of a DVB-T demodulation on the software defined radio subsystem 906 of FIG. 9 according to an embodiment herein. In particular, the mapping 1300 illustrates how various DVB-T demodulation processes are partitioned across the different clusters. The NCO and mixer 1302 followed by an IF to baseband converter 1304, a down-sampler 1306, an adjacent channel filtering 1308 and an interpolation filter 1310 functions are performed on the SCC unit 908. A time domain synchronization 1312, a Fast Fourier Transform (FFT) 1314, a frequency domain synchronization 1316, a pilot processing 1318, a fine symbol synchronization 1322, a frame sync detection 1324, a channel estimation 1320, a channel correction and de-mapping 1326 and a bit interleaving 1328 are performed on the SPC unit 910 using one or multiple CPUs. The LMS equalizer is optionally used for long echo channel shortening. The remaining processes constituting a viterbi decoding 1330, an outer deinterleaver 1332, a reed-solomon decoder and de-randomizer 1334 are performed in the channel decoding cluster unit 914. The final transport stream packet creation is done using the TSO module.

Figure 14:
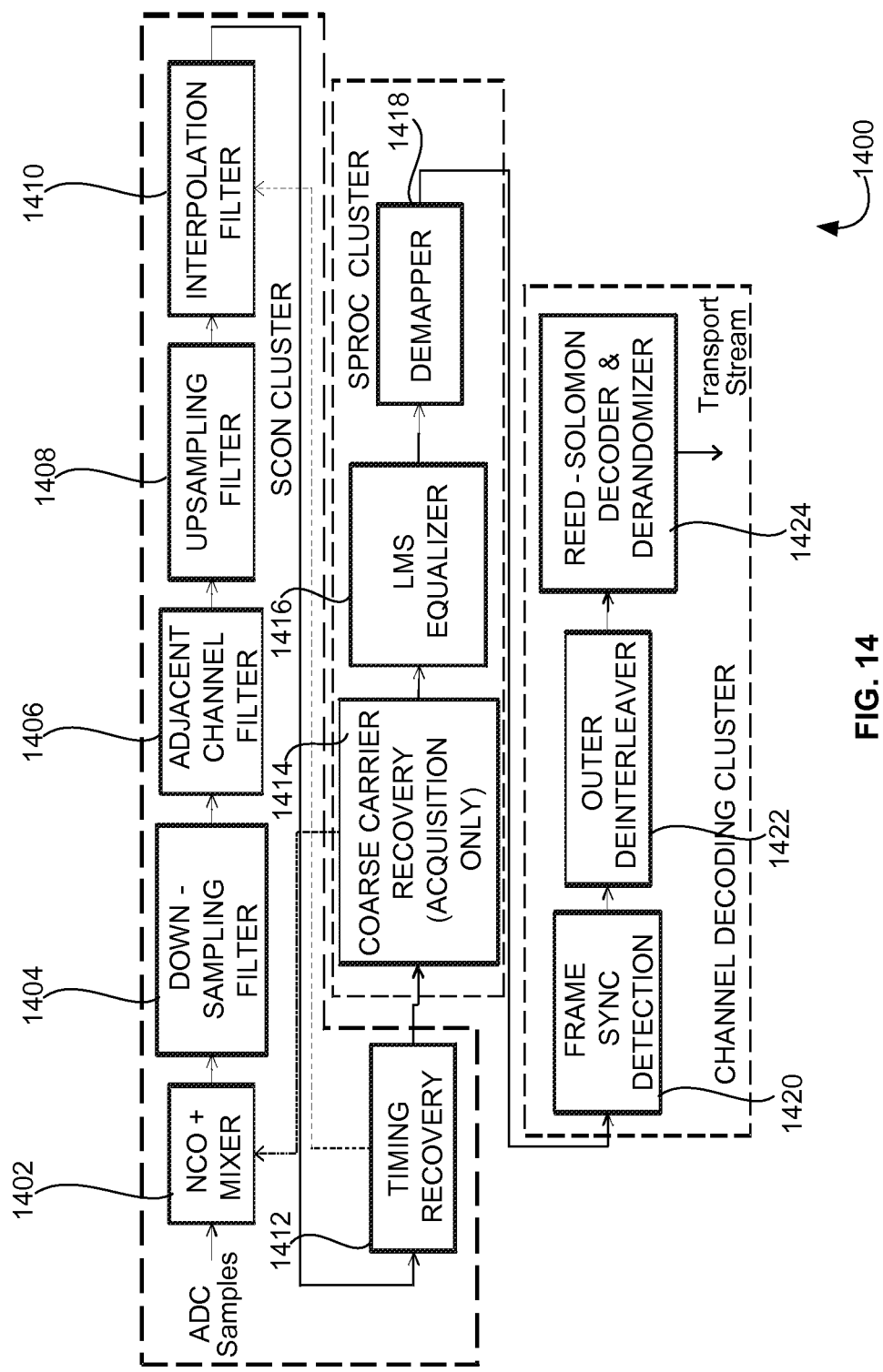
FIG. 14 illustrates a cable demodulator partitioning (J.83A and J.83C) on the software defined radio subsystem of FIG. 9 according to an embodiment herein.

FIG. 14 illustrates a cable demodulator partitioning 1400 (J.83A and J.83C) on the software defined radio subsystem 906 of FIG. 9 according to an embodiment herein. The NCO and mixer 1402 is followed by a down sampling filter 1404, an adjacent channel filter 1406, an up sampling filter 1408, an interpolation filter 1410 and a timing recovery functions 1412 are mapped on the signal conditioning cluster unit 908. The functions of a coarse carrier recovery 1414, a LMS equalization 1416, a de-mapping 1418 are mapped on the SPC unit 910. The remaining functions such as a frame synchronization 1420, an outer deinterleaver 1422, a reed-solomon decoder and de-randomization 1424 are implemented on the channel decoding cluster unit 914.

Figure 15:
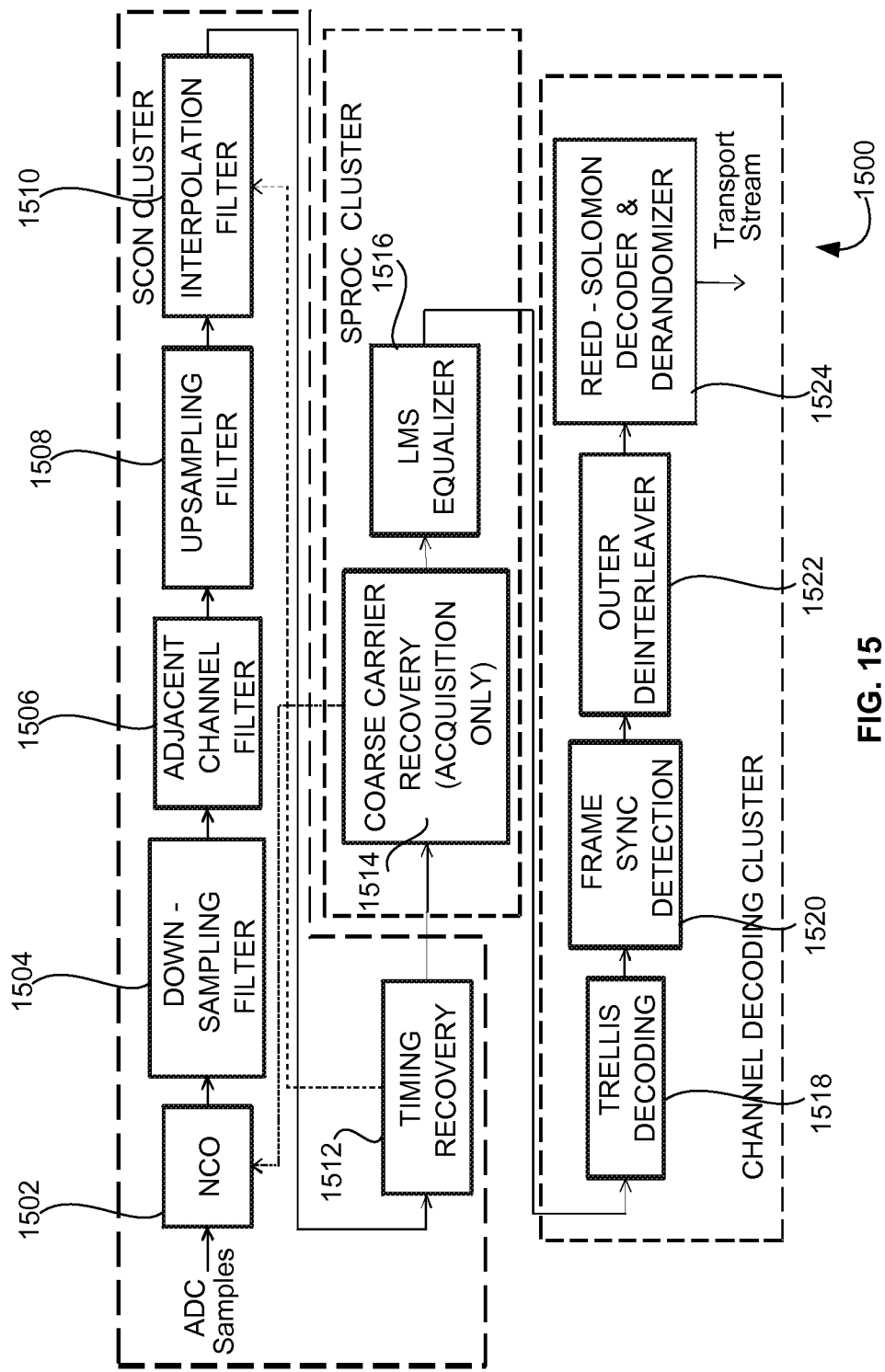
FIG. 15 illustrates a cable demodulator partitioning (J.83B) on the software defined radio subsystem of FIG. 9 according to an embodiment herein.

FIG. 15 illustrates a cable demodulator partitioning (J.83B) 1500 on the software defined radio subsystem 906 of FIG. 9 according to an embodiment herein. A NCO and mixer 1502 followed by a down sampling filter 1504, an adjacent channel filter 1506, an up sampling filter 1508, an interpolation filter 1510 and a timing recovery functions 1512 are mapped on the SPC unit 908. The functions of a coarse carrier recovery 1514 and a LMS equalization 1516 are mapped on the SPC unit 910. The remaining functions such as a trellis decoding 1518, a frame synchronization 1520, an outer deinterleaver 1522, a reed-solomon decoder and de-randomization 1524 are implemented on the channel decoding cluster unit 914.

Figure 16:
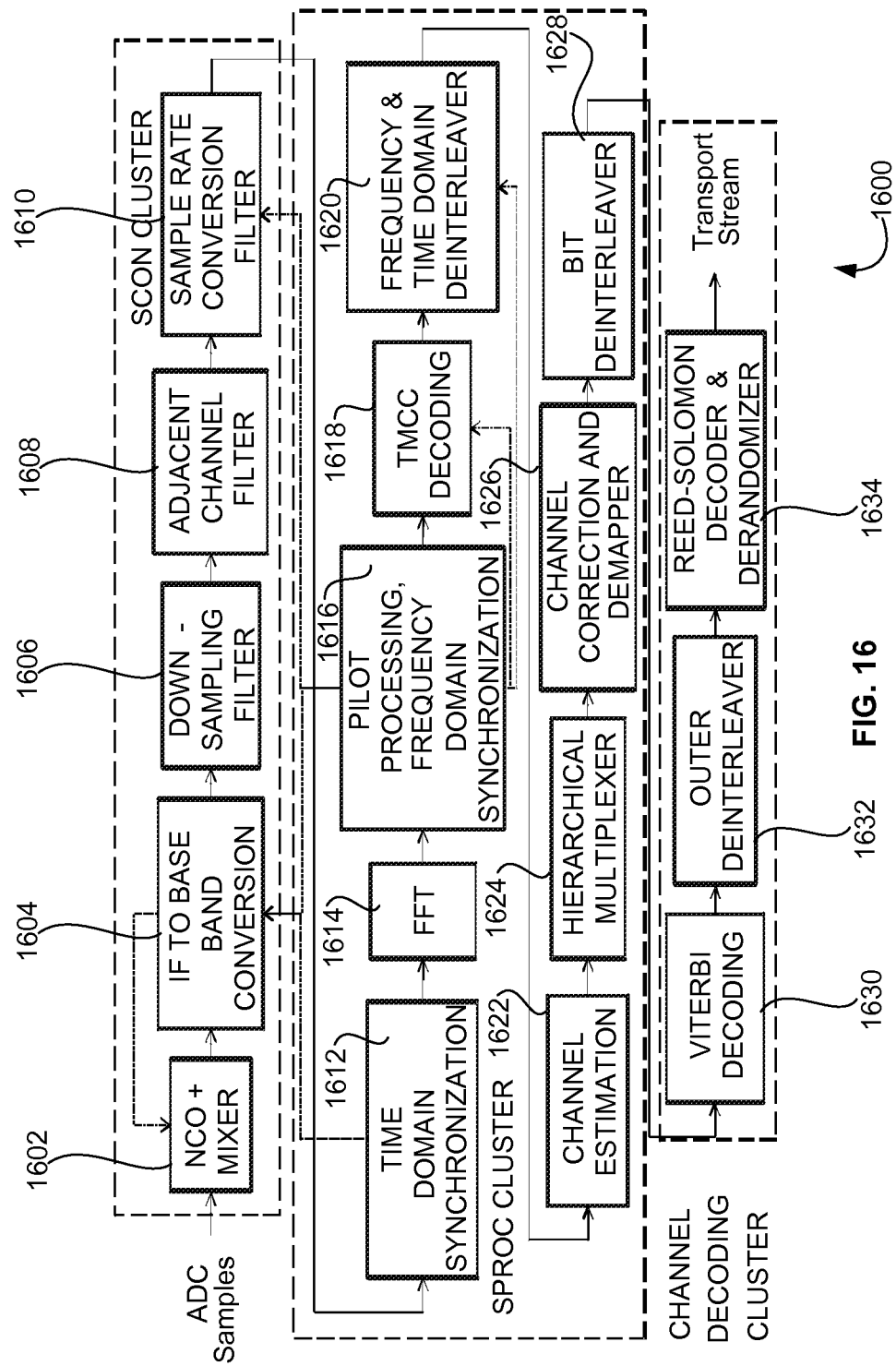
FIG. 16 illustrates a mapping of an ISDB-T standard to the software defined radio subsystem of FIG. 9 according to an embodiment herein.

FIG. 16 illustrates a mapping 1600 of an ISDB-T standard to the software defined radio subsystem 906 of FIG. 9 according to an embodiment herein. The mapping 1600 illustrates how the various ISDB-T demodulation processes are partitioned across the different clusters. A NCO and mixer 1602 followed by an IF to baseband conversion 1604, a down-sampler 1606, an adjacent channel filtering 1608 and a sample rate convertor 1610 functions are performed on the SCC unit 908.

A time domain synchronization 1612, a Fast Fourier Transform (FFT) 1614, a frequency domain synchronization and a pilot processing 1616, a TMCC decoding 1618, a frequency & time domain deinterleaver 1620, a channel estimation 1622, a hierarchical multiplexer 1624, a channel correction and de-mapping 1626 and a bit deinterleaver 1628 are performed on the SPC unit 910 across one or multiple CPUs. The remaining processes constituting a Viterbi decoding 1630, an outer byte de-interleaving 1632, a reed-solomon decoder and de-randomizer 1634 are performed in the channel decoding cluster unit 914. The final transport stream packet is generated by the TSO module.

Figure 17:
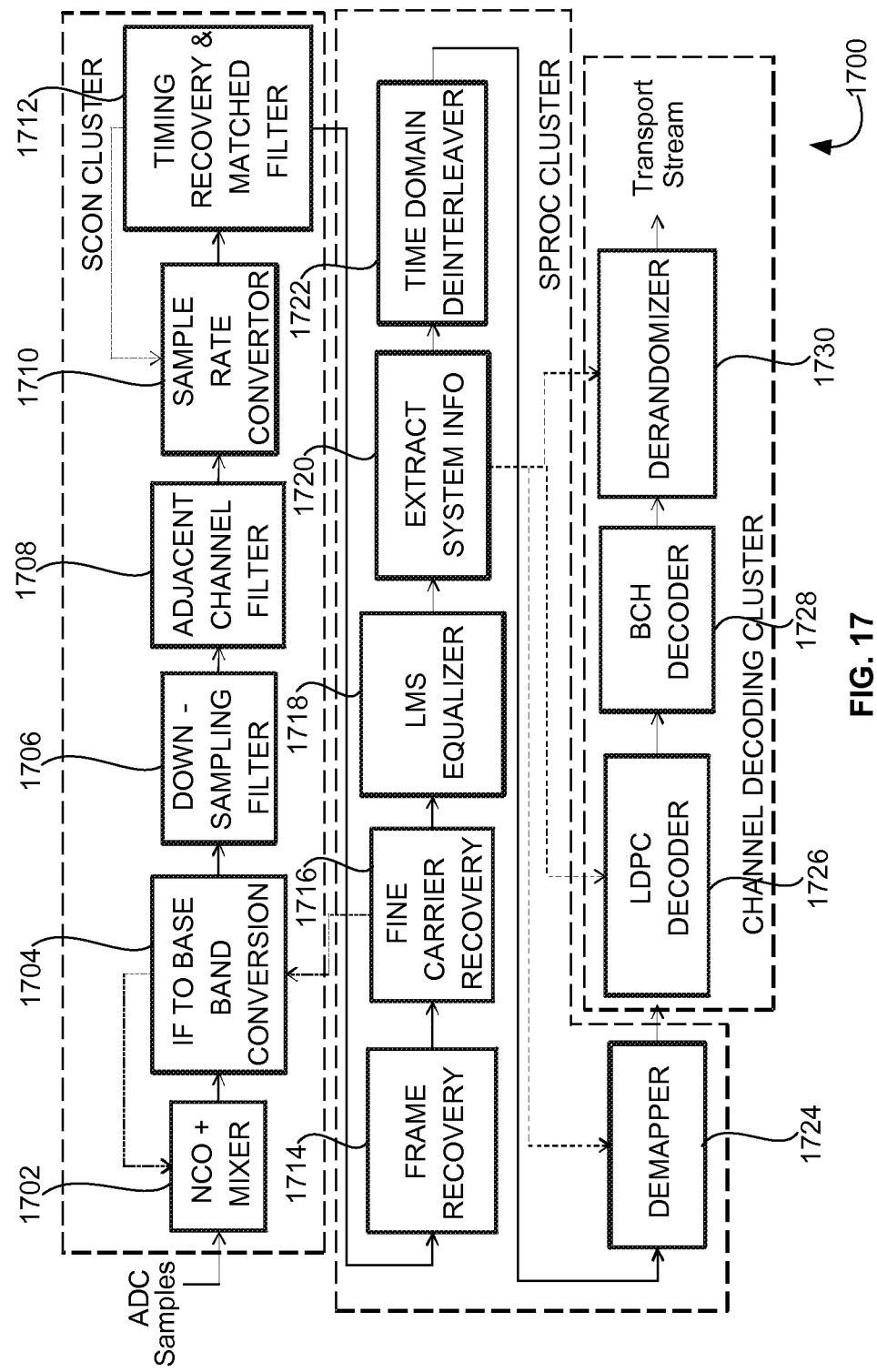
FIG. 17 illustrates a DMB-T single carrier mode mapping to the software defined radio subsystem of FIG. 9 according to an embodiment herein.

FIG. 17 illustrates a DMB-T single carrier mode mapping 1700 to the software defined radio subsystem 906 of FIG. 9 according to an embodiment herein. A NCO and mixer 1702 enables an IF to baseband conversion 1704 in the SCC unit 908. This is followed by a down-sampler 1706, an adjacent channel filtering 1708, a sample rate convertor 1710, a timing recovery and matched filter 1712 functions performed on the SCC unit 908. A frame recovery 1714, a fine carrier recovery 1716, a channel estimation processes are performed in the SPC unit 910. The LMS equalizer 1718 in case of single carrier mode is responsible for channel equalization. Further processes of extraction of a system information 1720, a time domain de-interleaving 1722 and de-mapping 1724 are performed on the SPC unit 910 across one or multiple CPUs. The remaining processes constituting a LDPC Decoding 1726, BCH decoding 1728 and a de-randomizer 1730 are performed in the channel decoding cluster unit 914. The final transport stream packet is generated by the TSO module.

Figure 18:
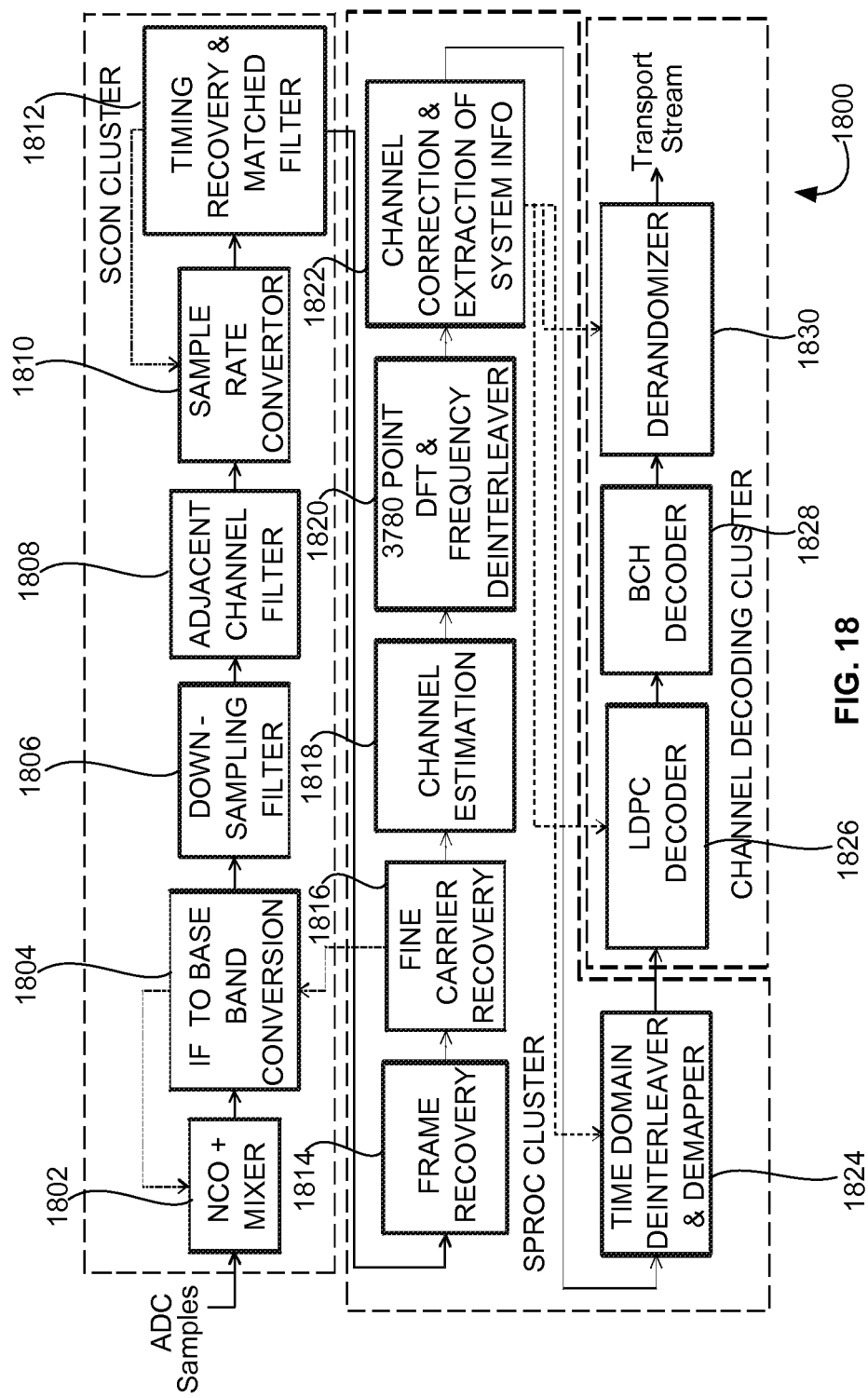
FIG. 18 illustrates a DMB-T Multi-carrier mode mapping to the software defined radio subsystem of FIG. 9 according to an embodiment herein.

FIG. 18 illustrates a DMB-T multi-carrier mode mapping 1800 to the software defined radio subsystem 906 of FIG. 9 according to an embodiment herein. A NCO and mixer 1802 are followed by IF to baseband conversion 1804, a down-sampler 1806, an adjacent channel filtering 1808, a sample rate convertor 1810, a timing recovery and a matched filter 1812 functions on the SCC unit 908. A frame recovery 1814, a fine carrier recovery 1816, a channel estimation and correction 1818, a 3780 point DFT and frequency de-interleaving 1820, an extraction of system information 1822, a time de-interleaving and de-mapping 1824 processes are performed in the SPC unit 910 on one or multiple CPUs. The remaining processes constituting a LDPC decoding 1826, a BCH decoding 1828 and a de-randomizer 1830 are performed in the channel decoding cluster unit 914. The final transport stream packet is generated by the TSO module.

Figure 19:
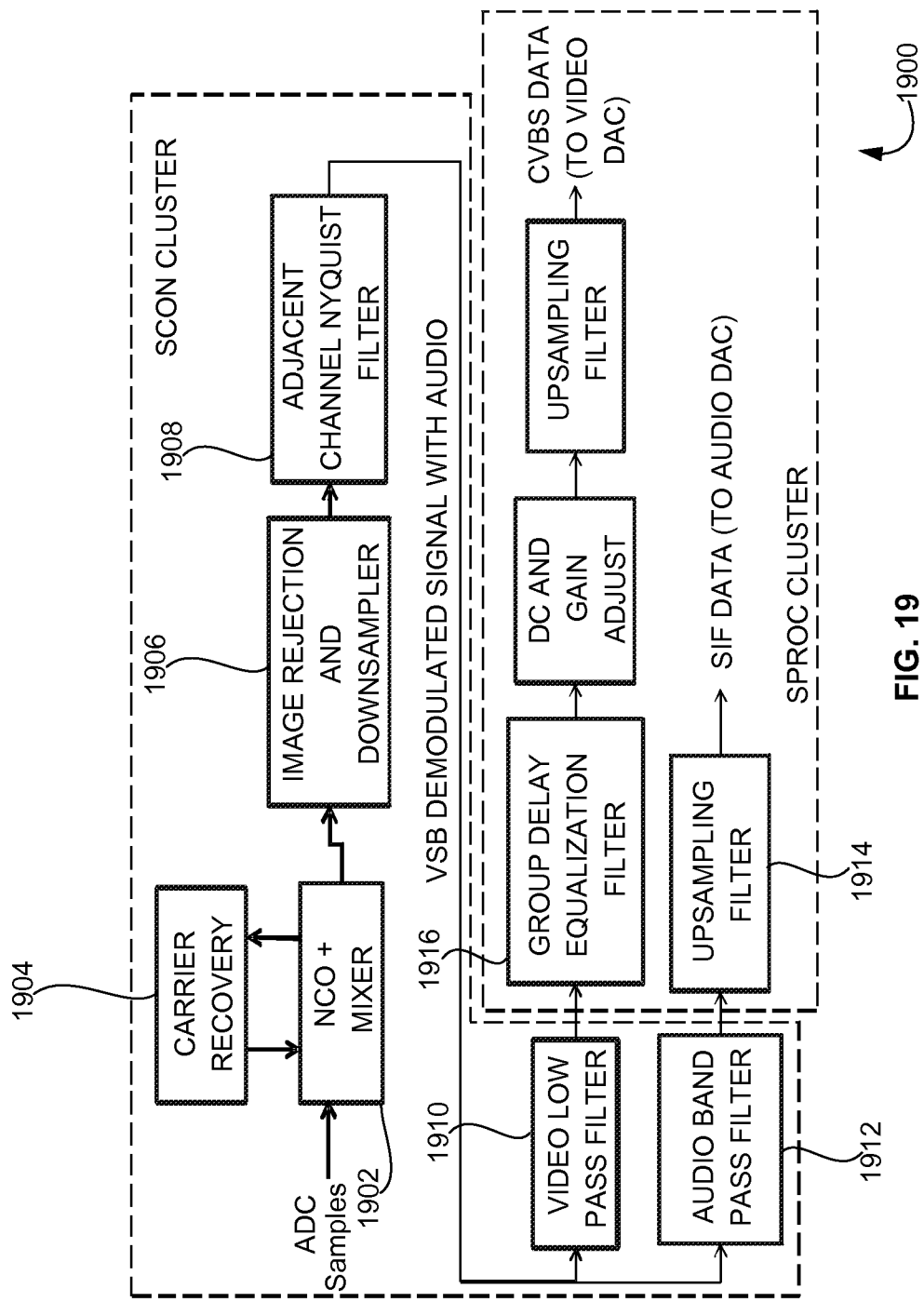
FIG. 19 illustrates an analog TV standard mapping on the software defined radio subsystem of FIG. 9 according to an embodiment herein.

FIG. 19 illustrates an analog TV standard mapping 1900 on the software defined radio subsystem 906 of FIG. 9 according to an embodiment herein. The FIG. 1900 illustrates a mapping analog TV standard on the SDR subsystem 906 across the different clusters. A NCO and mixer 1902 followed by a carrier recovery 1904, a down-sampling and image rejection filter 1906, an adjacent channel nyquist filter 1908 and a video low pass filter 1910 and an audio band pass filter 1912 are performed on the SCC unit 908. The output from the audio band pass filter 1912 is fed to an up-sampling filter 1914 operating in one of the CPU's in the SPC unit 910. The output of the up-sampling filter 1914 is fed to an on-chip or off-chip SIF DAC.

The output of the video low pass filter is fed to the LMS coprocessor 1110 which performs the group delay equalization filtering 1916 function. The output from this filter is further up-sampled on another CPU in the SPC unit 910. The output of the up-sampling filter is fed to an on-chip or off-chip CVBS DAC. The outputs from the SPC unit 910 are bypassed to the CVBS DAC and SIF DAC outputs through the channel decoding cluster unit 914.

Figure 20:
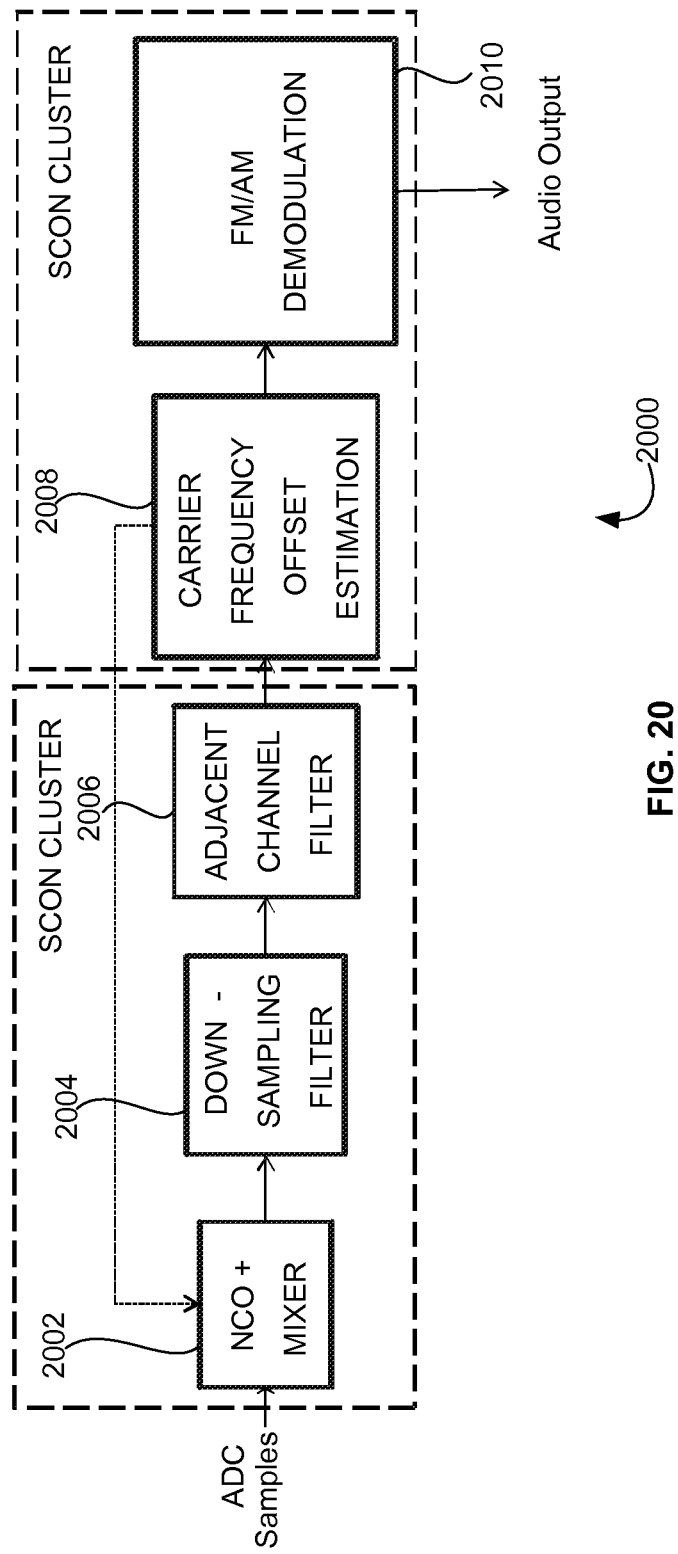
FIG. 20 illustrates a FM and AM demodulation mapping on the software defined radio subsystem of FIG. 9 according to an embodiment herein.

FIG. 20 illustrates a FM and/or AM demodulation mapping 2000 on the software defined radio subsystem 906 of FIG. 9 according to an embodiment herein. The mapping 2000 illustrates how FM and AM demodulation on the SDR subsystem 906 of FM and AM functionality is partitioned. A NCO and mixer 2002 functions followed by a down-sampling filter 2004 and an adjacent channel filter 2006 are implemented on the SCC unit 908. The functions of a carrier frequency estimation 2008 and FM or AM demodulation 2010 are implemented on the SPC unit 910. The audio stream generated is bypassed through the channel decoding cluster unit 914 to be sent to an audio DAC.

Figure 21:
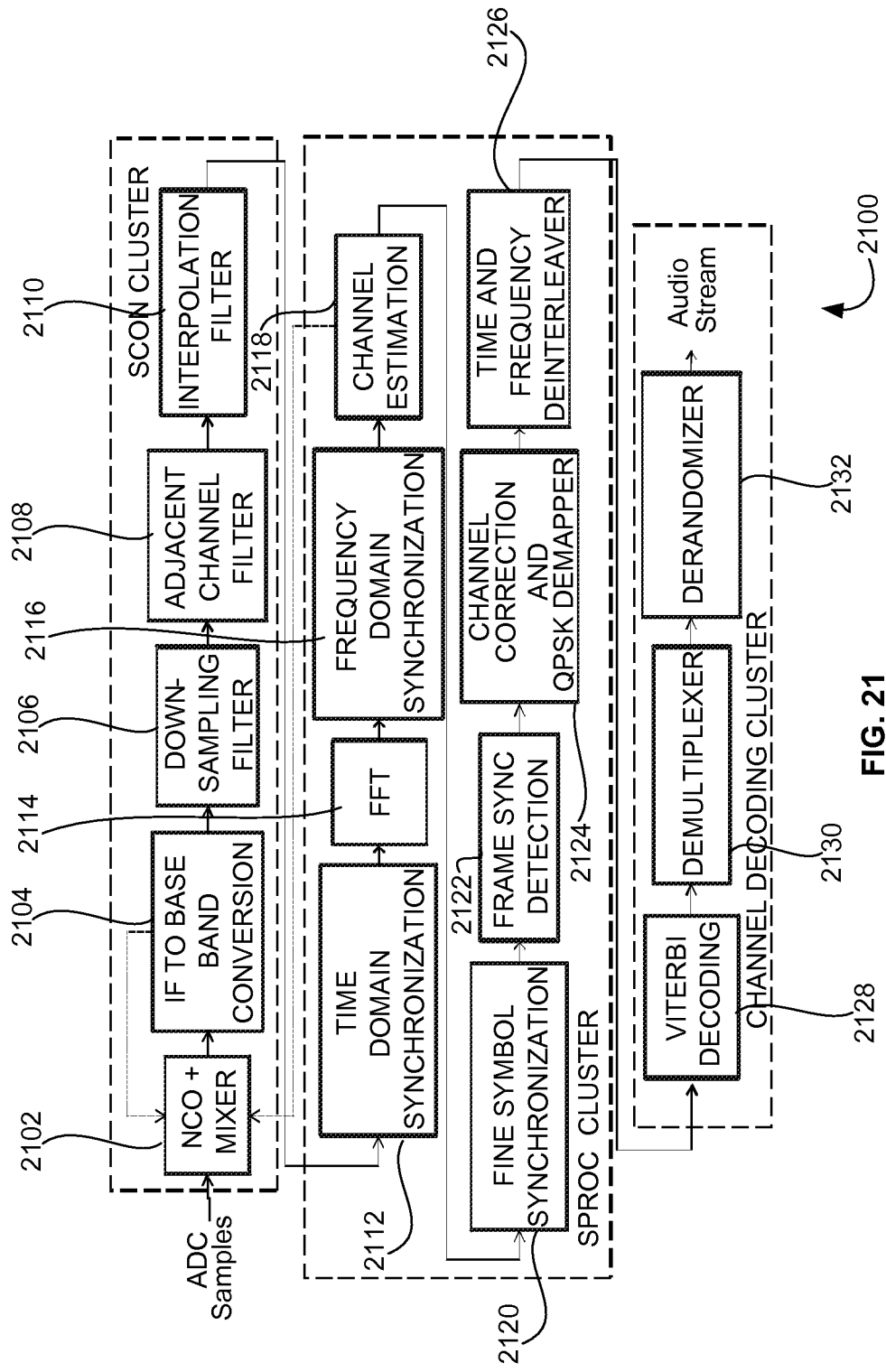
FIG. 21 illustrates a DAB demodulation on mapping on the software defined radio subsystem of FIG. 9 according to an embodiment herein.

FIG. 21 illustrates a DAB demodulation mapping 2100 on the software defined radio subsystem 906 of FIG. 9 according to an embodiment herein. The mapping 2100 illustrates how the DAB demodulation on SDR subsystem 906 of a digital audio broadcast functionality is partitioned. A NCO and mixer 2102 functions are followed by IF to baseband conversion 2104, a down-sampling filter 2106, an adjacent channel filter 2108 and an interpolation filter 2110 are implemented on the SCC unit 908. The functions of a time domain synchronization 2112, a fft 2114, a frequency domain synchronization 2116, a channel estimation and correction 2118, a fine symbol synchronization 2120, a frame sync detection 2122, a QPSK de-mapping 2124 and a time domain and frequency domain deinterleaver 2126 are implemented on the SPC unit 910. A viterbi decoding 2128, a de-multiplexing 2130 and de-randomization 2132 functions are performed in the channel decoding cluster unit 914 to generate audio stream.

Figure 22:
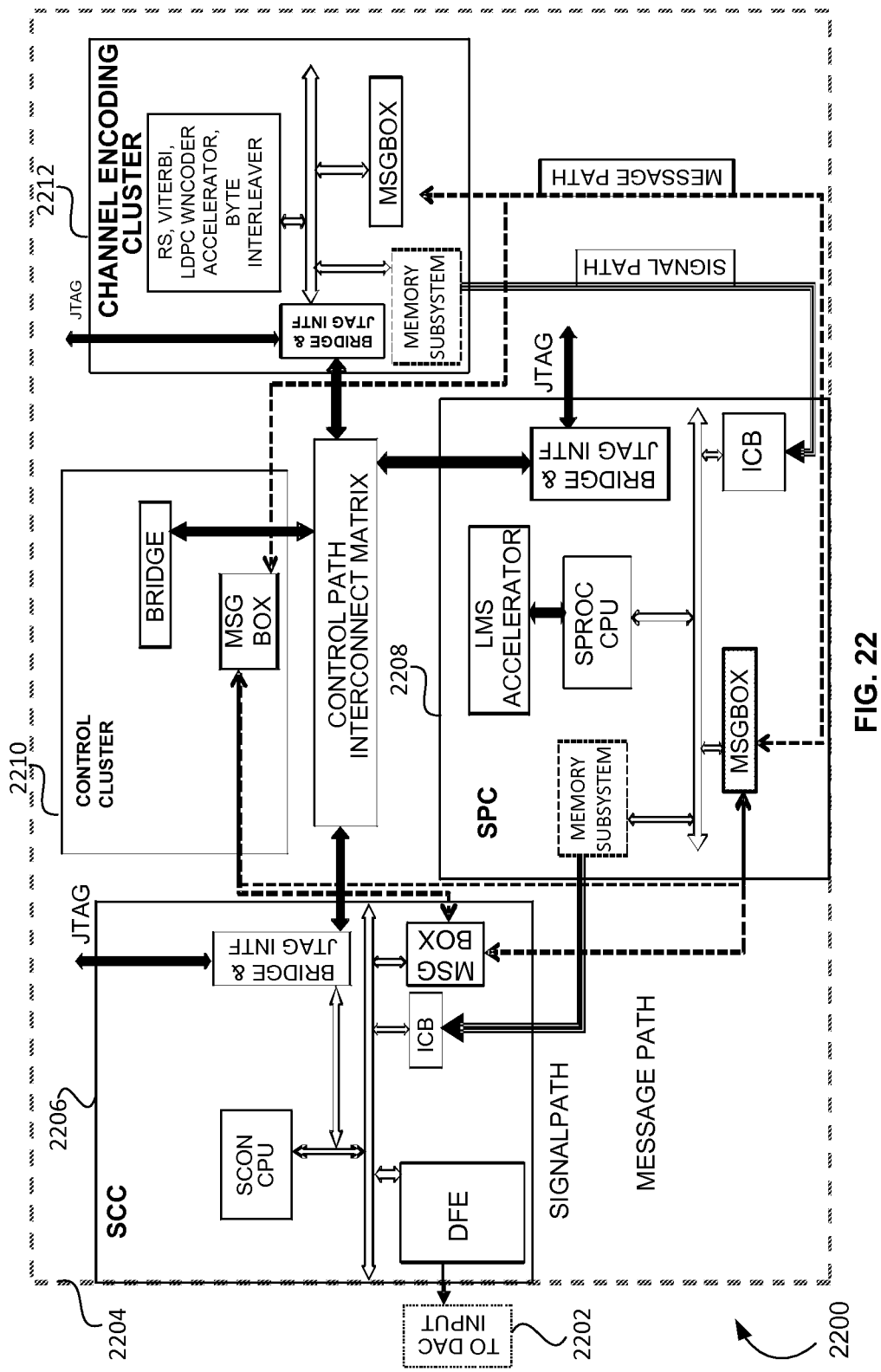
FIG. 22 illustrates the software defined radio transmitter system that includes a software defined radio subsystem of FIG. 8 for universal TV signal modulation according to an embodiment herein.

FIG. 22 illustrates the software defined radio transmitter system 2200 that includes a software defined radio subsystem of FIG. 8 for universal TV signal modulation according to an embodiment herein. The SDR transmitter system 2200 includes (i) a Digital to Analog Converter (DAC) 2202 and (ii) a software defined radio subsystem 2204. The software defined radio subsystem 2204 includes (i) a signal conditioning cluster 2206, (ii) a signal processing cluster 2208, (iii) a control cluster 2210 and (iv) a channel encoding cluster 2212 to implement a transmit path function. In such a case the channel encoding cluster 2212 performs a RS encoding, a convolution encoding, a low-density parity-check encoding and an interleaving operation by collecting the required data transport stream input and produces encoded bits. The data from the channel encoding cluster 2212 is passed to the signal processing cluster 2208 and from signal processing cluster 2208 to the signal conditioning cluster 2206. For instance, a Television (TV) signal transmitter is considered as an example.

This is done by interchanging the components of a FIFO, a DMA and an Inter-cluster buffer as compared to the previous (receiver) configurations across the clusters. Once the configuration are changed the signal path goes from channel encoding to signal processing and finally to signal conditioning. The signal processing cluster 2208 maps the encoded bits to waveform and performs a framing, IFFT for OFDM based standards or performs a required modulation as per the broadcasting standard. The signal processing cluster 2208 outputs a modulated baseband signal.

The modulated baseband signal is transferred to the signal conditioning cluster 2206 for spectrum shaping and filtering. The spectrum shaped signal is transmitted either by optionally up-converting using a mixer and NCO combination or as is at baseband from the DFE sub module of the signal conditioning cluster 2206. The up-conversion can be performed externally before transmitting spectrum shaped signal for a baseband signal. This data is passed through a digital to analog converter to transmit a baseband signal or an IF signal. In a similar manner the transmitter path of other digital communication standards can also be mapped and implemented using the software defined radio subsystem 2200.

Figure 23:
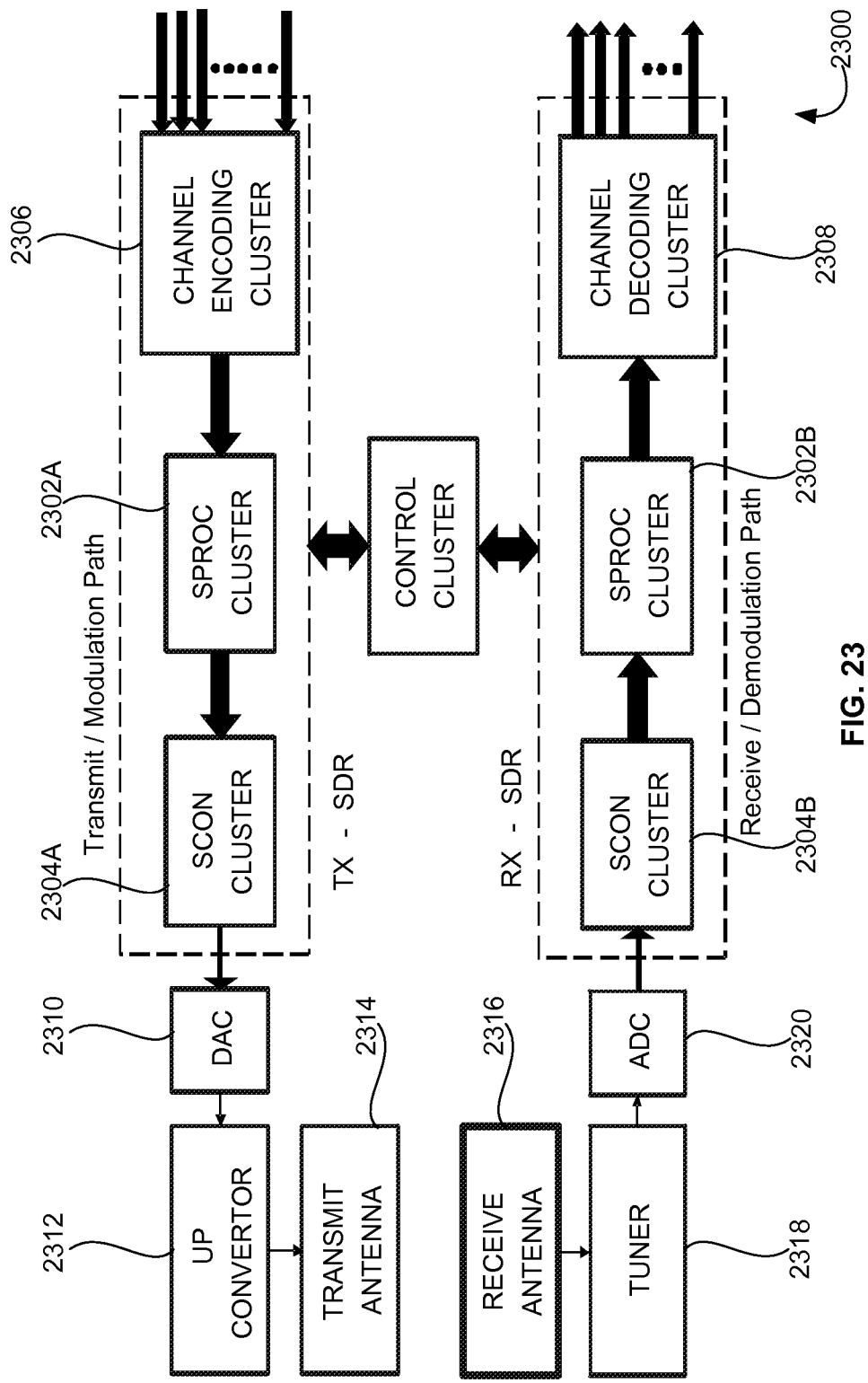
FIG. 23 illustrates a usage of the software defined radio modem that includes a software defined radio subsystem of FIG. 8 for a universal modulation and demodulation function according to an embodiment herein.

FIG. 23 illustrates the software defined radio modem 2300 that includes a software defined radio subsystem of FIG. 8 for universal TV signal modulation and demodulation according to an embodiment herein. The usage of the SDR subsystem 800 for a universal modem 2300 includes a signal processing cluster 2302A and 2302B, a signal conditioning cluster 2304A and 2304B, a channel encoding cluster 2306, a channel decoding cluster 2308, a digital to analog convertor 2310, an up convertor 2312, a transmit antenna 2314, a receive antenna 2316, a tuner 2318, an analog to digital convertor 2320, a signal conditioning cluster 2304B, and a signal processing cluster 2302B. The proposed SDR subsystem that includes a signal processing clusters 2302A and 2302B and signal conditioning clusters 2304A and 2304B can be used along with an additional channel encoding cluster 2306 and channel decoding clusters 2308 to implement a universal modulator and demodulator functionality. For instance, a Television (TV) signal modem is considered as an example.

In this scheme, the transmit path and receive path are shown. The transmit path includes outgoing data being processed via a channel encoding cluster 2306, followed by the signal processing cluster 2302A and finally sent out after being processed by the signal conditioning cluster 2304A. This outgoing signal is fed to a digital to analog convertor 2310 which is up-converted and sent via the transmit antenna 2314. The receive path includes incoming signals from an antenna 2316 which pass through the tuner 2318 to obtain Intermediate frequency or zero IF signals. These signals are digitized using an analog to digital converter 2320 to generate real or complex samples. As explained in previous sections the real or complex signals are processed by the signal conditioning cluster 2304B for sample processing followed by the signal processing cluster 2302B for symbol processing and finally de-mapped to generate bits. The generated bits are passed through a channel decoding cluster 2308 to remove errors process final data bits.

Figure 24:
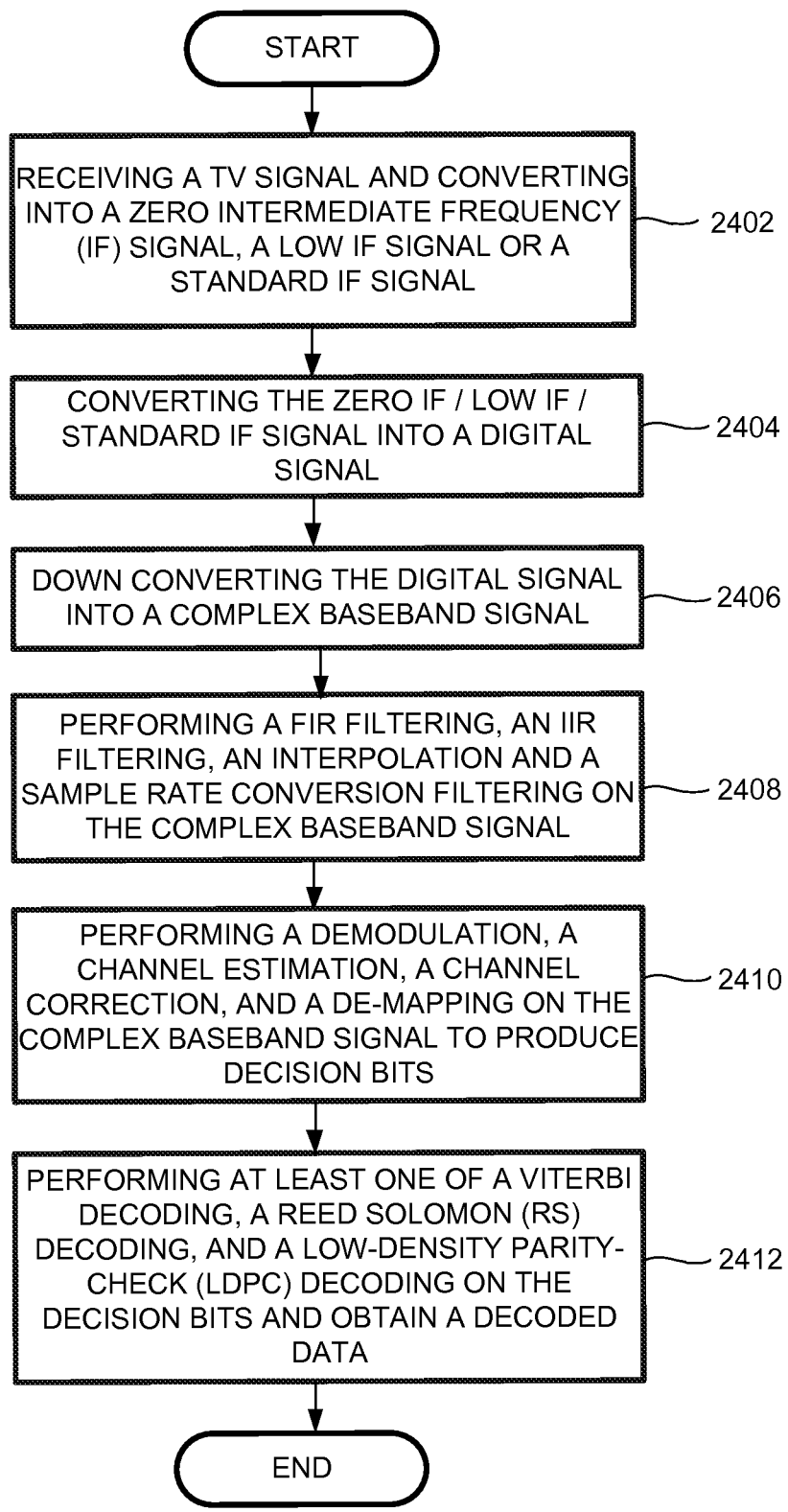
FIG. 24 illustrates a flow chart for a method of performing universal TV signal demodulation in the SDR receiver system of FIG. 9 according to an embodiment herein
Figure 25:
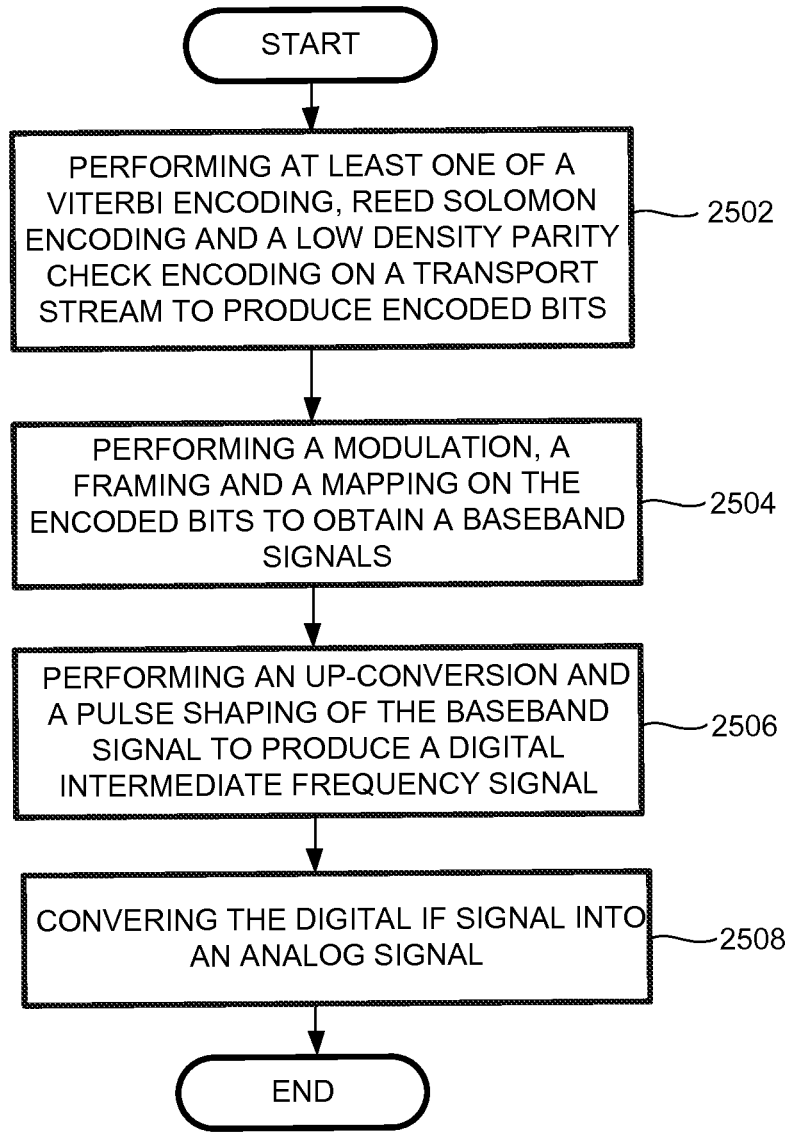
FIG. 25 illustrates a flow chart for a method of performing universal TV signal modulation in the SDR transmitter system of FIG. 22 according to an embodiment herein.

FIG. 24 is a flow chart illustrating a method of performing universal TV signal demodulation in the SDR receiver system of FIG. 9 according to an embodiment herein. In step 2402, a Television (TV) signal (e.g., an input signal—the TV signal) is received at tuner and converted into one of a zero Intermediate Frequency (IF) signal, a low IF signal or a standard IF signal. In step 2404, the zero IF signal or low IF signal or standard IF signal is converted into a digital signal. In step 2406, the digital signal is down converted into a complex baseband signal. In step 2408, a FIR filtering, an IIR filtering, an interpolation and sample rate conversion filtering are performed on the complex baseband signal using the Signal Conditioning CPU (SCON CPU) that is adapted for the sample based signal processing. In step 2410, a demodulation, a channel estimation, a channel correction and a de-mapping are performed on the complex baseband signal to produce decision bits using the Signal Processing CPU (SPROC CPU) that is adapted for a block based signal processing. In step 2412, a viterbi decoding, a Reed Solomon (RS) decoding and a Low-Density-Parity-Check (LDPC) decoding are performed on the decision bits and obtain a decoded data. Loading and storing of the complex baseband signal may be performed to enable a filtering operation, using the load-store slot of the Signal Conditioning CPU (SCON CPU). The FIR filtering, the IIR filtering, the interpolation and the sample rate conversion filtering may be performed using the filter slot of the SCON CPU on a on a complex baseband signal obtained from the load-store slot. Arithmetic operations may be performed that are required for the filtering operation the arithmetic slot of the SCON CPU. The demodulation, the channel estimation, the channel correction, and the de-mapping may be performed on the filtered complex baseband signal using the complex arithmetic slot and the cordic slot of the Signal Processing CPU (SPROC CPU). FIG. 25 is a flow chart illustrating a method of performing universal TV signal modulation in the SDR transmitter system of FIG. 22 according to an embodiment herein. In step 2502, a viterbi encoding, a Reed Solomon (RS) encoding, a convolution encoding and a Low-Density-Parity-Check (LDPC) encoding are performed on a transport stream (e.g., an input signal—the TV signal) to produce encoded bits. In step 2504, a modulation, a framing and mapping operations are performed on the encoded bits to produce a baseband signal using the Signal Processing CPU (SPROC CPU) that is adapted for a block based signal processing. In step 2506, an up-conversion and a pulse shaping is performed on the baseband signal to produce a digital Intermediate Frequency (IF) signal using the Signal Conditioning CPU (SCON CPU) that is adapted for a sample based signal processing. In step 2508, the digital IF signal is converted into an analog signal. The modulation, the framing and the mapping may be performed on the encoded bits using the complex arithmetic slot and the cordic slot of the Signal Processing CPU (SPROC CPU). The up-conversion and the pulse shaping of the baseband signals may be performed the load-store slot, the filter slot, and the arithmetic slot of the Signal Conditioning CPU (SCON CPU).

Figure 26:
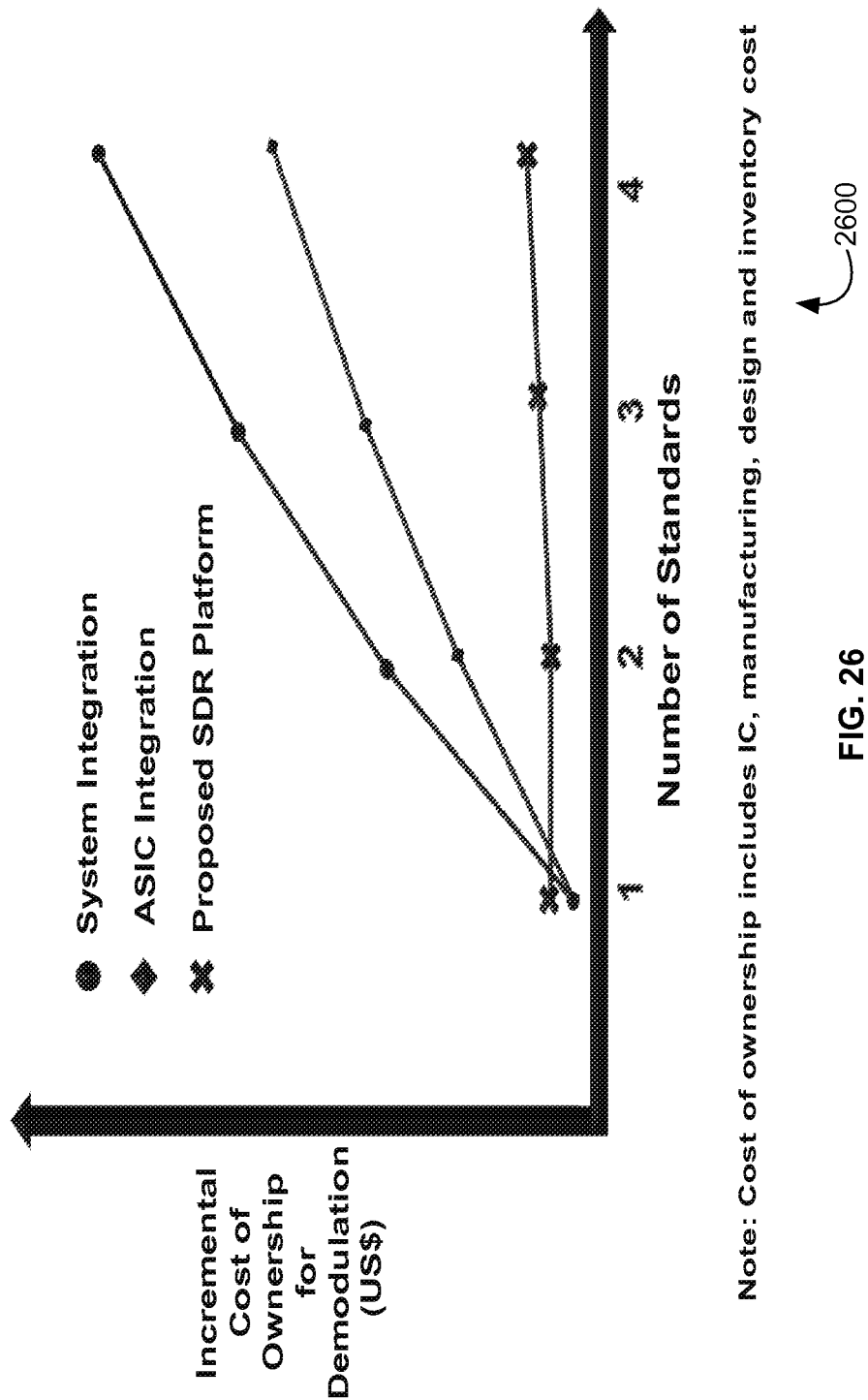
FIG. 26 illustrates a graphical comparison of an incremental cost of ownership versus a number of TV standards supported for a system integration approach, an ASIC integration approach as compared to the proposed software defined radio subsystem of FIG. 8 according to an embodiment herein.

FIG. 26 illustrates a graphical comparison 2600 of an incremental cost of ownership versus a number of TV standards supported for a system integration approach, an ASIC integration approach as compared to the proposed software defined radio platform of FIG. 9 according to an embodiment herein. As the number of standards is increased, the incremental cost of ownership for the system integration approach increases rapidly. The incremental cost of ownership for the ASIC integration approach increases in a linearly. However, in the case of the proposed software defined radio platform, the incremental cost of ownership increases only marginally with an increased in the number of standards.

The SDR Subsystem is capable of supporting multiple communication standards (e.g., multiple analog and multiple digital communication standards) and has the ability to interface to Zero-IF, Low-IF and Standard-IF signals from the RF tuner. This capability is enabled by the presence of a Numerically Controlled Oscillator (NCO) which is switchable between the ADC subsystem and the signal conditioning CPU. For the case when the RF tuner generates a zero-IF signal the NCO is switched out of the path, thus allowing the IQ ADC's digitized samples to be directly consumed by the signal conditioning CPU. For the case when the tuner is either Low-IF or Standard-IF the NCO is switched into the path between the ADC and the signal conditioning CPU. The NCO is fed with the appropriate numerical value which enables the frequency translation of the spectrum of the input signal to a baseband frequency centred about zero. The resulting signal is now consumed by the signal conditioning CPU for further processing steps.

The combination of the various DSP Processors in single of multiple instances (namely the signal conditioning CPU (SCON CPU)) is optimized for high speed sample rate processing. The signal processing CPU (SPROC CPU) is adapted for a block based Signal processing. The process of optimizing the SCON CPU and the SPROC CPU enables to handle all the signal processing required for analog TV signal demodulation up to generation of Sound Intermediate Frequency (SIF) signal and Complex Video Baseband Signal (CVBS) and in case of digital TV standard demodulation up to de-mapper outputs. These generated bits can be subsequently fed to an Inner and Outer Forward Error Correction block to generate a Transport Stream. The Execution Units of the different cores and the unique partitioning of the different signal processing tasks enable to achieve demodulation of TV Standards as well as Radio Standards such as Amplitude Modulation (AM), Frequency Modulation (FM) and Digital Audio Broadcasting (DAB).

The architecture of the SDR Subsystem along with the flexible memory interconnects and multiple Signal Conditioning CPUs enables support of higher input sample rates thus allowing any kind of ADC rates to be supported. In addition, multiple signal processing CPUs enables support of arbitrarily high symbol rates. Hence this scalable architecture ensures support of all digital and analog TV standards. The SDR subsystem's components include the signal conditioning CPU's. The SCON CPU is a VLIW architecture consisting of 4 execution slots namely the arithmetic slot, logic slot, filter & scalar load-store unit with broadcast capability.

The SDR subsystem's components consist of a Least Mean Square (LMS) hardware accelerator which is used for both adaptive and non-adaptive filtering and is tightly coupled to the SPROC CPU's cordic unit for data transfer. The adaptive filtering is used for time domain equalizers in single carrier standards and long echo suppression in multicarrier standards. In case of analog TV standards this unit is used for additional FIR filtering at very high sampling rates. In combination with a channel encoder cluster which is capable of performing encoding function for RS, viterbi, LDPC and interleaving, the signal conditioning CPU and the signal processing CPU perform a transmit path or modulator function. The instruction set architecture of signal processing CPU makes it ideal for performing any modulation functions.

In addition, the Instruction set architecture of signal conditioning cluster makes it suitable for all kinds of filtering operations thus enabling it to perform spectral shaping and stage before the signal is transmitted. The combination of NCO and mixer up-converts the desired signal to required frequency band. Hence if the desired signal is passed through a digital to analog convertor, an IF or baseband output can be obtained. The SDR subsystem components of signal processing (SPROC) cluster and signal conditioning (SCON) Cluster can be reused for both transmit and receive functions to be effectively used for universal modulation and demodulation. When used in conjunction with a control CPU and channel decoding and channel encoding cluster functions this enables to build a universal modem for supporting digital communication standards.

The software defined radio subsystem 906 enables a single global TV chassis since it is able to demodulate all digital TV and analog TV standards. The system cost reduction for a global TV chassis is up to a 20% cost reduction per chassis on a $50 bill of material. Thereby, margins are maintained through feature addition. As an example, radio Standards such as FM, AM and DAB can be easily supported without any additional cost. This reduces cost by preventing additional redesigns or device re-spins. The software defined radio subsystem 906 allows support of future standards thus enabling faster time to market of TV OEMs. In addition, it is designed to demodulate all the broadcast TV standards for different types of media and regions. The modulation capability using these components may be further extended to design a universal modem.

The software-defined radio subsystem is a radio communication system where components that have been typically implemented in hardware are instead implemented by means of software on a personal computer or embedded computing devices. Significant amounts of signal processing are handed over to the general-purpose processor, rather than being done in special-purpose hardware. Such a design produces a radio which can receive and transmit widely different radio protocols based solely on the software used.

The software defined radio subsystem enables field upgrade of TV platforms based on region specific and terrain specific conditions, which is a not usually possible using fixed hardware solution. This reduces cost by preventing additional redesigns or device re-spins. For example if some channel conditions in Nordic countries are not met or some Brazil profiles are not met, there is a better chance of supporting it on such SDR subsystem using a software update. The SDR building blocks can be used as a minimum of 2 instances or more multiples, consisting of combinations of transmitter and receiver SDR to implement universal modem functionality.

While the foregoing description is exemplary of the preferred embodiments, those of ordinary skill in the relevant arts will recognize many variations, alterations, modifications, substitutions and the like as are readily possible, especially in light of this description, the accompanying drawings and the claims drawn hereto. The description describes exemplary embodiments particularly in relation to multiple Analog as well as Digital Television (TV) standards, however the SDR subsystem and the methods for modulation, demodulation and trans-modulation disclosed herein can be implemented for any other multiple communication standards as envisaged by a person of ordinary skill in the art. In any case, the foregoing detailed description should not be construed as a limitation, which is limited only by the claims appended hereto.

What is claimed is:

1. A Software Defined Radio (SDR) subsystem capable of supporting multiple communication standards, for modulation and demodulation of an input signal, said SDR subsystem comprising:
    a Signal Conditioning Cluster (SCC) unit;
    a Signal Processing Cluster (SPC) unit; and
    a Channel Codec Cluster (CCC) unit that performs a channel encoding and a channel decoding;
    wherein said SCC unit (i) receives a baseband signal from said SPC unit and produces a digital Intermediate Frequency (IF) signal for said modulation, and (ii) receives an IF signal from a tuner and produces a complex baseband signal for said demodulation; wherein said SPC unit (i) receives encoded bits from said CCC unit and produces said baseband signal for said modulation, and (ii) receives said complex baseband signal from said SCC unit and produces decision bits for said demodulation; wherein said CCC unit (i) receives said input signal and produces said encoded bits for said modulation, and (ii) receives said decision bits from said SPC unit and produces a decoded data for said demodulation.

2. The SDR subsystem of claim 1, wherein said SCC unit (i) receives said baseband signal from said SPC unit and produces said digital Intermediate Frequency (IF) signal based on a first communication standard for a trans-modulation, and (ii) receives said IF signal from said tuner and produces said complex baseband signal based on a second communication standard for said trans-modulation.

3. The SDR subsystem of claim 2, wherein said SPC unit (i) receives said encoded bits from said CCC unit and produces said baseband signal based on said first communication standard for said trans-modulation, and (ii) receives said complex baseband signal from said SCC unit and produces said decision bits based on said second communication standard for said trans-modulation.

4. The SDR subsystem of claim 1, wherein said multiple communication standards comprise analog and digital communication standards, wherein said SCC unit further comprises: a Digital Front End (DFE) unit that comprises: a Numerically Controlled Oscillator (NCO) that operates at a sample-rate frequency and that performs a digital down-conversion of said IF signal into said complex baseband signal; a plurality of Signal Conditioning (SCON) CPUs adapted for a sample based signal processing that (i) perform a pulse shaping of said baseband signal from said SPC unit for said modulation, and (ii) perform a Finite Impulse Response (FIR) filtering, an Infinite Impulse Response (IIR) filtering, an interpolation, and a sample rate conversion filtering on said complex baseband signal from said NCO for said demodulation; and a memory sub system that comprises: a store-and-forward buffer or a cut-through buffer for storing said complex baseband signal or said baseband signal; and a Direct Memory Access (DMA) unit that extracts data that corresponds to said complex baseband signal or said baseband signal from said store-and-forward buffer or said cut-through buffer based on a programmed threshold.

5. The SDR subsystem of claim 1, wherein said SPC unit comprises: a plurality of Signal Processing (SPROC) CPUs adapted for a block based signal processing that (i) perform a modulation, a framing and a mapping on said encoded bits from said CCC unit to produce said baseband signal for said modulation of said input signal, and (ii) perform a demodulation, a channel estimation, a channel correction, and de-mapping of symbols on said complex baseband signal received from said SCC unit to produce said decision bits for said demodulation of said input signal; a Least Mean Squares (LMS) coprocessor coupled to said plurality of SPROC CPUs, wherein said LMS coprocessor performs an adaptive feedback and feed-forward FIR filtering, a coefficient or tap adaptation, and a high speed FIR filtering operation on multiple streams; and a memory subsystem that comprises: an Inter-Cluster Buffer (ICB); a Shared Memory Subsystem (SHM) that is connected across said plurality of SPROC CPUs wherein said SHM is used as a buffer for storing and exchanging of computed results between said plurality of SPROC CPUs; and a DMA unit that processes a transfer of a processed data to said CCC unit.

6. The SDR subsystem of claim 5, wherein said plurality of SPROC CPUs comprises: a complex arithmetic slot that performs at least one of real and complex arithmetic operations, wherein said operations include N-way Single Instruction Multiple Data (SIMD) operations, wherein said complex arithmetic slot supports Fast Fourier Transform (FFT) butterfly operations; and a cordic slot that generates (i) sine and cosine values and (ii) magnitude and phases of complex signals, wherein said cordic slot is coupled to said LMS coprocessor to perform cycle efficient read and write operations during an equalizer operation, wherein said cordic slot further performs N-way arithmetic, logic and extract operations.

7. The SDR subsystem of claim 1, wherein said CCC unit (i) receives said input signal and performs at least one of a viterbi encoding, a Reed Solomon (RS) encoding, and a Low-Density Parity-Check (LDPC) to produce said encoded bits for said modulation, and (ii) receives said decision bits from said SPC unit and performs at least one of a viterbi decoding, a Reed Solomon (RS) decoding, and a Low-Density Parity-Check (LDPC) to produce said decoded data for said demodulation.

8. A method for demodulating an input signal in software defined radio (SDR) subsystem that is capable of supporting multiple communication standards, said method comprising:
receiving from a tuner one of a zero Intermediate Frequency (IF) signal, a low IF signal, and a standard IF signal;
down converting one of said low IF signal, and said standard IF signal into a down converted IF signal;
performing a FIR filtering, an IIR filtering, an interpolation and a sample rate conversion filtering on said down converted IF signal to produce a filtered complex baseband signal using a Signal Conditioning CPU (SCON CPU) adapted for a sample based signal processing;
performing a demodulation, a channel estimation, a channel correction, and a de-mapping on said filtered complex baseband signal based on said multiple communication standards to obtain decision bits using a Signal Processing CPU (SPROC CPU) adapted for a block based signal processing; and
performing at least one of a Viterbi decoding, a Reed Solomon (RS) decoding, and a Low-Density Parity-Check (LDPC) decoding on said decision bits to obtain decoded data.

9. The method of claim 8, further comprising: performing loading and storing of said complex baseband signal, using a load-store slot of said Signal Conditioning CPU (SCON CPU), to enable filtering operation; performing, using said filter slot of said SCON CPU, said FIR filtering, said IIR filtering, said interpolation and said sample rate conversion filtering on a complex baseband signal obtained from said load-store slot; and performing, using an arithmetic slot of said SCON CPU, arithmetic operations required for filtering operation.

10. The method of claim 8 further comprising performing, using a complex arithmetic slot and a cordic slot of said Signal Processing CPU (SPROC CPU), said demodulation, said channel estimation, said channel correction, and said de-mapping on said filtered complex baseband signal.

11. A method for modulating an input signal in a software defined radio (SDR) subsystem that is capable of supporting multiple communication standards, said method comprising:
performing at least one of a Viterbi encoding, a Reed Solomon (RS) encoding, convolution encoding and a Low-Density Parity-Check (LDPC) encoding on said input signal to produce encoded bits;
performing a modulation, a framing, and a mapping on said encoded bits based on said multiple communication standards to obtain baseband signals using a Signal Processing CPU (SPROC CPU) adapted for a block based signal processing;
performing an up-conversion and a pulse shaping of said baseband signals to produce a digital IF signal using a Signal Conditioning CPU (SCON CPU) adapted for a sample based signal processing;
converting said digital IF signal into an analog signal; and
performing, using a complex arithmetic slot and a cordic slot of said Signal Processing CPU (SPROC CPU), said modulation, said framing and said mapping on said encoded bits.

12. The method of claim 11 further comprising performing, using a load-store slot, a filter slot, and an arithmetic slot of said Signal Conditioning CPU (SCON CPU), said up-conversion and said pulse shaping of said baseband signals.

\* \* \* \* \*

UNITED STATES PATENT AND TRADEMARK OFFICE
Certificate

Patent No. 8,571,119 B2                                                            Patented: October 29, 2013

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Parag Naik, Bangalore (IN); Anindya Saha, Karnataka (IN); Hemant Mallapur, Karnataka (IN); Sunil Hr, Karnataka (IN); Gururaj Padaki, Karnataka (IN); and Vishwakumara Kayargadde, Bangalore (IN).

Signed and Sealed this First Day of July 2014.

*DANIEL WASHBURN*
*Supervisory Patent Examiner*
*Art Unit 2634*
*Technology Center 2600*